(12) United States Patent
Sakai et al.

(10) Patent No.: US 9,150,962 B2
(45) Date of Patent: Oct. 6, 2015

(54) METHOD FOR PRODUCING SUBSTRATE WITH METAL BODY

(71) Applicant: JSR Corporation, Tokyo (JP)

(72) Inventors: Tatsuya Sakai, Tokyo (JP); Hideki Nishimura, Tokyo (JP); Masahiro Yamamoto, Tokyo (JP); Hisashi Nakagawa, Tokyo (JP); Ryuuichi Saitou, Tokyo (JP); Hideyuki Aoki, Tokyo (JP); Tsuyoshi Furukawa, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 14/159,444

(22) Filed: Jan. 21, 2014

(65) Prior Publication Data

US 2014/0134331 A1   May 15, 2014

Related U.S. Application Data

(63) Continuation of application No. PCT/JP2012/068063, filed on Jul. 17, 2012.

(30) Foreign Application Priority Data

Jul. 21, 2011  (JP) ................. 2011-159844

(51) Int. Cl.
| | |
|---|---|
| *C23C 16/06* | (2006.01) |
| *H01L 21/285* | (2006.01) |
| *H01L 21/3205* | (2006.01) |
| *H01L 21/768* | (2006.01) |
| *C23C 16/18* | (2006.01) |

(52) U.S. Cl.
CPC ............... *C23C 16/06* (2013.01); *C23C 16/18* (2013.01); *H01L 21/28556* (2013.01); *H01L 21/32051* (2013.01); *H01L 21/76843* (2013.01); *H01L 21/76877* (2013.01)

(58) Field of Classification Search
None
See application file for complete search history.

(56) References Cited

U.S. PATENT DOCUMENTS

| 2002/0054958 A1* | 5/2002 | Birkmire et al. ........... 427/248.1 |
| 2006/0024443 A1* | 2/2006 | Sakai et al. ............... 427/255.28 |

(Continued)

FOREIGN PATENT DOCUMENTS

| JP | 06-349833 | 12/1994 |
| JP | 11-195652 | 7/1999 |

(Continued)

OTHER PUBLICATIONS

Nikkei Microdevices Oct. 2004., pp. 38-47, w/ English translation of relevant parts.

(Continued)

*Primary Examiner* — Joseph Miller, Jr.
(74) *Attorney, Agent, or Firm* — Oblon, McClelland, Maier & Neustadt, L.L.P.

(57) ABSTRACT

Provided is a method for producing a substrate with a metal body. This method provides excellent film-forming properties (reflectance and adhesion), is easy to be used on a large substrate, and can be carried out at a low cost. The method includes the steps of: (A) heating a complex to a first temperature so as to generate a vapor of the complex; and (B) contacting the vapor with a substrate heated to a second temperature that is not higher than the first temperature so as to form a metal body containing a central metal of the complex, either in uncombined form or as a compound thereof (exclusive of the complex), on at least part of a surface of the substrate. The second temperature in step (B) is lower than the decomposition temperature of the complex. The central metal of the complex is aluminum or titanium.

10 Claims, 9 Drawing Sheets

(56) References Cited

U.S. PATENT DOCUMENTS

| | | | |
|---|---|---|---|
| 2006/0244082 A1* | 11/2006 | Ahn et al. | 257/410 |
| 2008/0102205 A1* | 5/2008 | Barry et al. | 427/250 |
| 2011/0020546 A1* | 1/2011 | Hamalainen et al. | 427/250 |
| 2011/0244130 A1* | 10/2011 | Abendroth et al. | 427/255.36 |

FOREIGN PATENT DOCUMENTS

| | | | |
|---|---|---|---|
| JP | 2001-064776 | | 3/2001 |
| JP | 2003-277930 | | 10/2003 |
| JP | 2005-520687 | | 7/2005 |
| JP | 2007-031367 | | 2/2007 |
| WO | WO2010/043215 | * | 4/2010 |

OTHER PUBLICATIONS

International Search Report for corresponding International Application No. PCT/JP2012/068063, Sep. 18, 2012.

International Preliminary Report on Patentability with Translation of Written Opinion of the International Searching Authority for corresponding International Application No. PCT/JP2012/068063, Sep. 18, 2012.

* cited by examiner

METHOD FOR PRODUCING SUBSTRATE WITH METAL BODY

BACKGROUND OF THE INVENTION

1. Field of the Invention

The present invention relates to a method for producing (i.e. manufacturing) a substrate with a metal body.

2. Description of the Related Art

The formation of a film composed of a metal or a metal compound (also referred to as a "metal film" in this specification) on a substrate such as a silicon substrate is widely carried out to produce electrodes and interconnects in semiconductor devices such as dynamic random access memories (DRAMs) and reflective coatings in optical devices. Aluminum is an example of a material that is widely used in such metal films. The leading methods of forming metal films have hitherto included sputtering, vapor deposition and chemical vapor phase growth (see, for example, Japanese Patent Application Laid-open Nos. H6-349833 and H11-195652). However, because these methods require a high-vacuum apparatus and a high-output power supply, there arise problems such as the difficulty in responding to larger substrates, high energy consumption and high process costs.

Recently, in the pursuit of higher functionality in electronic devices such as DRAMs, the structures of interconnects and electrodes within such devices have become increasingly smaller and more complex, creating a need to improve the precision of these shapes. The method of forming an interconnect or electrode in an electronic device generally entails forming a trench at the intended site for the interconnect or electrode on a substrate, filling the trench with the metal material that is to form the interconnect or electrode, and removing excess material by chemical mechanical planarization or the like.

In addition, structures having interconnects or electrodes are being developed as multilayer structures to achieve higher integration (see, for example, the October 2004 issue of *Nikkei Microdevices*). In such cases, the layers are electrically insulated from each other with interlayer dielectric films. By forming a hole in a portion of an interlayer dielectric film and filling the hole with a metal material that is intended to become an interconnect, a connection hole called contact hole, through hole, via hole, or the like is formed, and an electrical connection can be thereby achieved between the top layer and the bottom layer. When a metal material is filled into a trench or hole, the process time becomes even longer than for film formation on a level area, making the above-mentioned problems even more acute.

SUMMARY OF THE INVENTION

The object of this invention is to provide a method for producing (i.e. manufacturing) a substrate with (i.e. having or provided with) a metal body, which method provides excellent film-forming properties (reflectance and adhesion), is easy to be used on a large substrate, and can be carried out at a low cost.

As a result of extensive investigations, the inventor has discovered that the object of the invention can be achieved by a method for producing a substrate with a metal body, which method includes the steps of: heating a complex to a first temperature so as to generate a vapor of the complex; and contacting the vapor with a substrate heated to a second temperature that is not higher than the first temperature so as to form a metal body containing a central metal of the complex, either in uncombined form or as a compound thereof (exclusive of the complex), on at least part of a surface of the substrate.

The inventive method for producing a substrate with a metal body (which method is also referred to below as simply "the method of the invention") has excellent film-forming properties (reflectance and adhesion), and hence, a film-like metal body having good properties can be formed. The method of the invention is easy to be used on a large substrate, and can be carried out at a low cost.

DESCRIPTION OF THE PREFERRED EMBODIMENTS

Figure 1:
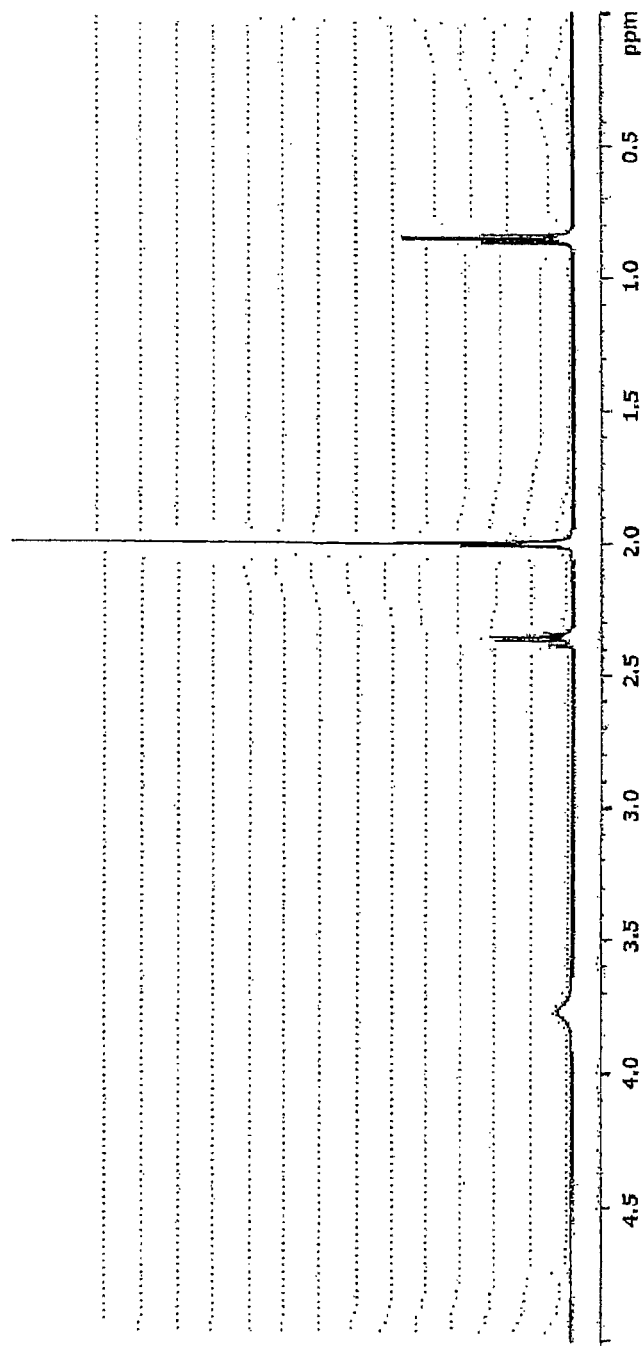
FIG. 1 shows an $^1$H-NMR spectrum for the complex of an amine compound and aluminum hydride obtained in Preparation Example 3.

A metal complex is used in the method of the invention. Examples of the metal complex include titanium complexes, palladium complexes and aluminum complexes. Examples of the ligands making up these complexes include carbonyl ligands, dienyl ligands and phosphine ligands. These complexes may include halogen atoms. In the following embodiments and examples, methods of forming a titanium-containing body (e.g., a titanium-containing film) on a substrate using a complex containing titanium as the central metal, and methods of forming an aluminum-containing body (e.g., an aluminum-containing film) on a substrate using a complex containing aluminum as the central metal are presented as examples, although the invention is not limited to these methods.

First Embodiment

Method of Forming a Titanium-Containing Film Using a Titanium Complex

An embodiment of a method of forming a titanium-containing body using a titanium complex is described in detail below. This embodiment includes the step of heating a titanium complex to a first temperature so as to generate a vapor of the titanium complex; and the step of contacting the generated vapor with a substrate heated to a second temperature that is not higher than the first temperature so as to form a titanium-containing body on at least part of a surface of the substrate.

[Substrate]

Examples of the material making up the substrate include glass, metal, silicon, dielectric film materials, and resins. Of these, dielectric film materials and resins are preferred.

Dielectric film materials and resins are explained below.

Examples of dielectric film materials include thermal oxide films, plasma-enhanced TEOS (PETEOS) films, high-density plasma-enhanced TEOS (HDP) films, silicon oxide films obtained by a thermal chemical vapor deposition (CVD) process, boron phosphorus silicate films (BPSG films), the dielectric films referred to as fluorinated silicon glass (FSG), and low-k dielectric film materials.

Thermal oxide films are formed by exposing silicon which has been raised to a high temperature to an oxidizing atmosphere, thereby inducing a chemical reaction between the silicon and the oxygen or between the silicon and moisture.

PETEOS films are formed by chemical vapor-phase growth from tetraethyl orthosilicate (TEOS) as the precursor in a process that includes the use of plasma as a promoting condition.

HDP films are formed by chemical vapor-phase growth from tetraethyl orthosilicate (TEOS) as the precursor in a process that includes the use of high-density plasma as a promoting condition.

Silicon oxide films obtained by thermal CVD are formed by atmospheric-pressure CVD (AP-CVD) or by low-pressure CVD (LP-CVD).

Boron phosphorus silicate films (BPSG films) can be obtained by atmosphere-pressure CVD (AP-CVD) or low-pressure CVD (LP-CVD).

The dielectric films referred to as FSG can be formed by chemical vapor-phase growth in a process that includes the use of high-density plasma as a promoting condition.

Examples of low-k dielectric film materials include organic SOG, hydrogen-containing SOG, low-k dielectrics composed of organic polymers, SiOF low-k dielectrics and SiOC low-k dielectrics.

"SOG," which is an abbreviation for "spin on glass," refers to a dielectric film material that has been formed into a film by applying a precursor onto a substrate, followed by heat treatment or the like.

Organic SOG is composed of a silicon oxide which contains organic groups such as methyl groups. Organic SOG can be obtained by applying a precursor containing, for example, a mixture of tetraethoxysilane and methyltrimethoxysilane onto a substrate, then carrying out heat treatment or the like.

Hydrogen-containing SOG is composed of a silicon oxide containing, for example, silicon-hydrogen bonds. Hydrogen-containing SOG can be obtained by applying a precursor containing, for example, triethoxysilane onto a substrate, then carrying out heat treatment or the like.

Examples of low-k dielectrics composed of organic polymers include low-k dielectrics containing, for example, a polyarylene, polyimide, polybenzocyclobutene or polyethylene fluoride as the primary ingredient.

SiOF low-k dielectrics are composed of fluorine atom-containing silicon oxide. SiOF low-k dielectrics can be obtained by the addition of fluorine (fluorine doping) to a silicon oxide film obtained by chemical vapor-phase deposition.

SiOC low-k dielectrics are composed of carbon atom-containing silicon oxide. SiOC low-k dielectrics can be obtained by chemical vapor-phase deposition using a mixture of silicon tetrachloride and carbon monoxide as the precursor.

Of the above low-k dielectric film materials, organic SOG, hydrogen-containing SOG, and low-k dielectrics composed of an organic polymer may have small pores in the formed film.

Illustrative examples of resins include polyethylene, polypropylene, polyvinyl alcohol, polycarbonate, polyethylene terephthalate, polyurethane, polyimide, polyacrylic, polyvinyl chloride, polyvinyl fluoride, fluoroplastics, thermoplastic norbornene resins, polyether resins, polyimide resins, polysulfone resins, and mixtures thereof.

The substrate may have a barrier film formed on the surface thereof. Examples of the material making up the barrier film include titanium, tantalum, titanium nitride and tantalum nitride. Of these, a material containing titanium atoms (titanium or a compound thereof) is especially preferred. By forming a barrier film on the substrate surface, the adhesion of a composition for forming the metal body to the substrate can be enhanced.

In this embodiment, the substrate may have small projections on the surface thereof. With the inventive method for producing a substrate with a metal body, the metal body can be properly filled into small gaps in the substrate surface. As used herein, "small gaps" includes interconnect trenches or electrode trenches formed on the substrate, and holes for connecting interconnects. Small gaps (e.g., trenches, holes) are formed on the above-described substrate by a known method (e.g., photolithography, etching).

The shape and size of the small gaps are not limited, and are preferably as follows.

The small gaps have an opening width (i.e., the minimum distance of the opening on the surface) which is preferably not more than 300 nm, more preferably from 3 to 100 nm, and even more preferably from 5 to 50 nm.

The aspect ratio of the small gaps (i.e., the value obtained by dividing the depth of a small gap by the opening width of the gap) is preferably from 1 to 50, more preferably from 3 to 40, and even more preferably from 5 to 25.

As used herein, "opening width" (minimum distance of surface opening) refers to the dimension of the opening at the substrate surface (that is, the small gap shape that forms the contour at the substrate surface) in the short direction of the opening. For example, when the small gap is a trench having a specific length in the longitudinal direction, the opening width is the dimension of the trench in the lateral direction perpendicular to the longitudinal direction of the trench. When the small gap is a hole that forms an elliptical shape on the substrate surface, the opening width is the dimension of the minor axis of the ellipse.

[Treatment of the Substrate]

The substrate used in this embodiment may be plasma-treated prior to the titanium-containing body-forming step.

Illustrative examples of gases used in plasma treatment include inert gases such as helium, argon, neon, krypton, xenon and radon; polymerizable unsaturated compound gases such as ethylene and propylene; and nitrogen, oxygen, carbon dioxide and air. In addition, these gases may be optionally mixed with reducing atmosphere gases such as hydrogen or ammonia, oxidizing gases such as oxygen, or silane gases and used.

Of these gases, the solitary use of helium or argon is preferred. From the standpoint of minimizing damage to the substrate, helium gas, which has a small atomic weight, is especially preferred. From the same standpoint, the power output of plasma treatment is preferably from 10 to 500 W, more preferably from 50 to 400 W, and even more preferably from 100 to 300 W. The irradiation time is preferably from 1 second to 1 minute, more preferably from 5 to 40 seconds, and even more preferably from 10 to 30 seconds. The temperature of the substrate is preferably from room temperature to 100° C. "Room temperature," unless specified otherwise, indicates 20° C. Plasma treating the substrate promotes formation of the metal body on the substrate, making it possible to improve adhesion of the metal body to the substrate and enhance film quality. When the substrate has small gaps therein, the gap-filling properties of the metal body can be further enhanced.

[Titanium-Containing Body Forming Step]

A titanium complex or a titanium complex-containing composition is used as the material for the titanium-containing body. In this embodiment, the titanium complex and the titanium complex-containing composition are sometimes referred to collectively as a "titanium-containing body-forming composition," and the titanium complex is sometimes referred to simply as a "complex."

The titanium complex used may be, for example, a titanium complex containing halogen atoms, a complex of titanium and a compound having conjugated carbonyl groups, a complex of titanium and a diene compound, a complex of titanium and an amine compound, or a complex of titanium and a phosphine compound. Some examples of complexes that may be used are represented by the following chemical formulas.

$$Ti(OR^1)_4 \quad (1)$$

In chemical formula (1), $R^1$ is an alkyl group, phenyl group, halogenated alkyl group or halogenated phenyl group of 1 to 10 carbons.

$$Ti(OR^2)_y(X)_{4-y} \quad (2)$$

In chemical formula (2), $R^2$ is an alkyl group or phenyl group, X is a halogen atom, and y is an integer from 0 to 3.

$$Ti(OR^3)_xL_{4-x} \quad (3)$$

In chemical formula (3), $R^3$ is an alkyl group, phenyl group, halogenated alkyl group or halogenated phenyl group of 1 to 10 carbons. L is a group of chemical formula (4) below, and x is an integer from 0 to 3.

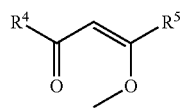

(4)

In chemical formula (4), $R^4$ and $R^5$ are each independently an alkyl group, phenyl group, alkoxy group, halogenated alkyl group or halogenated phenyl group of 1 to 10 carbons.

$$Ti(NR^6)_4 \quad (5)$$

In chemical formula (5), $R^6$ is an alkyl group or a phenyl group.

$$Ti(Cp)_n(Y)_{4-n} \quad (6)$$

In chemical formula (6), Cp is a cyclopentadienyl group, Y is a halogen atom or an alkyl group, and n is an integer from 1 to 4.

In chemical formulas (1) and (2), $R^1$ and $R^2$ are preferably each independently a methyl group, ethyl group, n-propyl group, i-propyl group, n-butyl group, t-butyl group, methoxy group, ethoxy group, n-propoxy group, i-propoxy group, n-butoxy group, t-butoxy group, hexyl group, cyclohexyl group, phenoxy group, methylphenoxy group or trifluoromethyl group, and more preferably a methyl group, ethyl group, n-propyl group, i-propyl group, n-butyl group, t-butyl group, hexyl group, cyclohexyl group or phenyl group.

In chemical formula (4), $R^4$ and $R^5$ are preferably each independently a methyl group, ethyl group, n-propyl group, i-propyl group, n-butyl group, t-butyl group, methoxy group, ethoxy group, n-propoxy group, i-propoxy group, n-butoxy group, t-butoxy group, phenoxy group, methylphenoxy group or trifluoromethyl group, and more preferably a methyl group, ethyl group, i-propyl group, t-butyl group, methoxy group, ethoxy group, i-propoxy group, t-butoxy group or trifluoromethyl group.

Illustrative examples of titanium compounds represented by chemical formula (1) include titanium methoxide, titanium ethoxide, titanium n-propoxide, titanium n-nonyloxide, titanium stearyloxide, titanium isopropoxide, titanium n-butoxide, titanium isobutoxide, titanium t-butoxide, titanium trimethylsiloxide, titanium 2-ethylhexoxide, titanium methoxypropoxide, titanium phenoxide, titanium methylphenoxide, titanium fluoromethoxide and titanium chlorophenoxide.

Illustrative examples of titanium compounds represented by chemical formula (2) include trimethoxytitanium chloride, triethoxytitanium chloride, tri-n-propoxytitanium chloride, tri-i-propoxytitanium chloride, tri-n-butoxytitanium chloride, tri-t-butoxytitanium chloride, triisostearoyltitanium chloride, dimethoxytitanium dichloride, diethoxytitanium dichloride, di-n-propoxytitanium dichloride, di-i-propoxytitanium dichloride, di-n-butoxytitanium dichloride, di-t-butoxytitanium dichloride, diisostearoyltitanium dichloride, methoxytitanium trichloride, ethoxytitanium trichloride, n-propoxytitanium trichloride, i-propoxytitanium trichloride, n-butoxytitanium trichloride, t-butoxytitanium trichloride, isostearoyltitanium trichloride and titanium tetrachloride.

Illustrative examples of titanium complexes represented by chemical formula (3) include tetrakis(penta-2,4-diketo)titanium, tetrakis(2,2,6,6-tetramethylhepta-3,5-diketo)titanium, tetrakis(1-ethoxybutan-1,3-diketo)titanium, tetrakis(1,1,1,5,5,5-hexafluoropenta-2,4-diketo)titanium, (2,2-dimethylhexa-3,5-diketo)titanium, bis(penta-2,4-diketo)titanium dimethoxide, bis(2,2,6,6-tetramethylhepta-3,5-diketo)titanium dimethoxide, bis(1-ethoxybutane-1,3-diketo)titanium dimethoxide, bis(1,1,1,5,5,5-hexafluoropenta-2,4-diketo)titanium dimethoxide, (2,2-dimethylhexa-3,5-diketo)titanium dimethoxide, bis(penta-2,4-diketo)titanium di-i-propoxide, bis(2,2,6,6-tetramethylhepta-3,5-diketo)titanium di-i-propoxide, bis(1-ethoxybutane-1,3-diketo)titanium di-i-propoxide, bis(1,1,1,5,5,5-hexafluoropenta-2,4-diketo)titanium di-i-propoxide and (2,2-dimethylhexa-3,5-diketo)titanium di-i-propoxide.

Illustrative examples of titanium compounds represented by chemical formula (5) include tetrakis(dimethylamino)titanium, tetrakis(methylethylamino)titanium, tetrakis(diethylamino)titanium, tetrakis(di-t-butoxyamino)titanium, tetrakis(di-i-propoxyamino)titanium and tetrakis(diphenylamino)titanium.

Illustrative examples of titanium compounds represented by chemical formula (6) include dicyclopentadienyltitanium dichloride, dicyclopentadienyltitanium dibromide, cyclopentadienyltitanium trichloride, cyclopentadienyltitanium tribromide, dicyclopentadienyldimethyltitanium, dicyclopentadienyldiethyltitanium, dicyclopentadienyldi-t-butyltitanium, dicyclopentadienylphenyltitanium chloride and dicyclopentadienylmethyltitanium chloride.

Of the complexes mentioned above as examples, complexes of titanium and an amine compound are preferred, and tetrakis(alkylamino)titaniums such as tetrakis(dimethylamino)titanium are especially preferred.

In the titanium-containing body-forming step, the titanium-containing body-forming composition is heated so as to generate a titanium complex vapor. The heating temperature is selected according to the molecular weight and structure of the titanium complex used, but is generally from 50 to 250° C., preferably from 80 to 200° C., and even more preferably from 100 to 150° C.

The heating temperature is preferably lower than the decomposition temperature of the complex used. The value obtained by subtracting the heating temperature from the decomposition temperature of the complex is preferably at least 10° C., more preferably at least 20° C., and even more preferably at least 40° C.

As used herein, "decomposition temperature of the complex" refers to the temperature at which the complex thermally decomposes within the atmosphere in which the metal body-forming step is carried out. For example, when a titanium-containing body-forming step is carried out in an inert gas (e.g., nitrogen gas or argon gas), this refers to the thermal decomposition temperature of the complex as measured in the inert gas.

The decomposition temperature of the complex can be measured by a known method. Examples of measurement methods include measurement by differential scanning calorimetry (DSC), measurement by thermogravimetry/differential thermal analysis (TG/DTA), and measurement by a combination thereof.

In a preferred method, the decomposition temperature is determined from the point of intersection between a tangent to the exothermic peak detected by TG/DTA measurement in the atmosphere (e.g., nitrogen gas or argon gas) in which the metal body-forming step is to be carried out at the base line on the low-temperature side of the peak and a tangent at the peak inflection point.

However, in cases where there are large fluctuations in the baseline, such as when the metal complex includes impurities, the exothermic peak detected by carrying out DSC measurement in a closed system may be treated as the decomposition temperature of the complex. In such a case, it is desirable for the gas within the closed vessel used for DSC measurement (e.g., within a stainless steel or aluminum pan) to be replaced with the ambient gas in which the metal body-forming step is to be carried out.

Next, the complex vapor that has been generated is supplied to the substrate and brought into contact therewith. The substrate temperature is set so as to be not higher than the heating temperature for the titanium-containing film-forming composition. The length of time during which the complex vapor and the substrate are brought into contact is set as appropriate for the substrate type and shape and for the desired film thickness, but is typically from 0.5 to 60 minutes, preferably from 1 to 30 minutes, and more preferably from 1 to 20 minutes.

The atmosphere preferred for carrying out the titanium-containing film-forming step is either an inert atmosphere which is, to the extent possible, free of oxygen, or a reducing atmosphere. An inert atmosphere can be achieved with an inert gas such as nitrogen gas, helium gas or argon gas. A reducing atmosphere can be achieved by mixing such an inert gas with a reducing gas. Examples of the reducing gas include hydrogen gas and ammonia gas. In cases where a reducing atmosphere is used as the atmosphere for the titanium-containing film-forming step, the reducing gas accounts for preferably from 1 to 70 mol %, and more preferably from 3 to 40 mol %, of the combined amount of inert gas and reducing gas.

In the titanium film-forming step, the titanium-containing film-forming composition and the substrate may be placed in a single treatment chamber, or they may be separately placed in two or more mutually communicating chambers. In cases where the titanium-containing film-forming composition and the substrate are placed at the interior of a single treatment chamber, the interior of the treatment chamber is heated to a predetermined temperature. The complex vapor generated from the heated titanium-containing film-forming composition comes into contact with the similarly heated substrate, forming a titanium-containing film on the surface of the substrate. To efficiently bring the complex vapor generated from the titanium-containing film-forming composition into contact with the substrate, gas flow may be induced within the treatment chamber in such a way that the titanium-containing film-forming composition is on the upstream side and the substrate is on the downstream side.

In cases where the titanium-containing film-forming composition and the substrate are separately placed in two or more mutually communicating chambers, the chamber in which the titanium-containing film-forming composition has been placed (also referred to below as the "precursor feed zone") is heated to a first temperature, thereby generating a vapor of the complex. The chamber in which the substrate has been placed (also referred to below as the "treatment zone") is heated to a second temperature which is not higher than the first temperature. The complex vapor generated in the precursor feed zone flows through a communicating member and into the treatment zone, where it comes into contact with the substrate that has been heated to the second temperature, thereby forming a titanium-containing film on the surface of the substrate. By setting the temperature of the treatment zone at this time lower than the temperature of the precursor feed zone, the complex vapor generated in the precursor feed zone can be efficiently carried to the treatment zone. Alternatively, the complex vapor generated in the precursor feed zone can be carried to the treatment zone by the circulation of a carrier gas such as nitrogen gas, helium gas or argon gas.

A valve may be provided in the communicating member so as to regulate the feed rate and velocity. For example, by providing two or more treatment zones for a single precursor zone, and additionally providing a valve in each communicating member, titanium-containing films can be efficiently formed on each of a plurality of substrates.

Second Embodiment

Method of Forming an Aluminum Body Using an Aluminum Complex

In this embodiment, an aluminum body-forming composition which contains a complex of an amine compound with aluminum hydride is used as the metal complex. The aluminum hydride (commonly called "alane") included in the complex is a compound composed of aluminum and hydrogen atoms, and is generally represented as $AlH_3$.

The complex used in this embodiment can be synthesized according to the methods described by, for example, J. K. Ruff et al. in *J. Amer. Chem. Soc.* vol. 82, p. 2141 (1960); G. W. Fraser et al. in *J. Chem. Soc.*, p. 3742 (1963); and J. L. Atwood et al. in *J. Amer. Chem. Soc.* vol. 113, p. 8133 (1991). In one example of such a method, synthesis is carried out by adding the hydrochloride salt of an amine compound to a diethyl ether suspension of lithium hydride aluminum and effecting a reaction under stirring at room temperature within N₂ gas. The reaction temperature, reaction solvent and other parameters may be suitably selected according to the type of complex desired.

The amine compound is a monoamine compound or a polyamine compound. Examples of polyamine compounds include diamine compounds, triamine compounds and tetramine compounds. Examples of monoamine compounds include monoamine compounds represented by general formula (7)

$$R^1R^2R^3N \qquad (7)$$

(wherein $R^1$, $R^2$ and $R^3$ are each independently a hydrogen atom, an alkyl group, an alkenyl group, an alkynyl group, an aryl group or an aralkyl group), and other monoamine compounds. The alkyl group, alkenyl group or alkynyl group of $R^1$, $R^2$ and $R^3$ in general formula (7) may be linear, cyclic or branched. Examples of alkyl groups include alkyl groups having from 1 to 12 carbons. Illustrative examples of the alkyl groups include a methyl group, ethyl group, propyl group, cyclopropyl group, butyl group, pentyl group, hexyl group, heptyl group, octyl group, nonyl group, decyl group, undecyl group, dodecyl group, cyclohexyl group, 2-methylbutyl group and 2-ethylhexyl group. Examples of alkenyl groups include a vinyl group, allyl group, crotyl group and ethynyl group. Examples of alkynyl groups include phenylethynyl group. Examples of aryl groups include phenyl group. Examples of aralkyl groups include benzyl group.

Illustrative examples of monoamine compounds other than the monoamine compound represented by general formula (7) include 1-azabicyclo[2.2.1]heptane, 1-azabicyclo[2.2.2]octane (quinuclidine), 1-aza-cyclohexane, 1-azacyclohexan-3-ene and N-methyl-1-azacyclohexane-3-ene.

Illustrative examples of the diamine compound include ethylenediamine, N,N'-dimethylethylenediamine, N,N'-diethylethylenediamine, N,N'-diisopropylethylenediamine, N,N'-di-t-butylethylenediamine, N,N'-diphenylethylenediamine, N,N,N',N'-tetramethylethylenediamine, N,N,N',N'-tetraethylethylenediamine and phenylenediamine. Illustrative examples of the triamine compound include diethylenetriamine, 1,7-dimethyl-1,4,7-triazaheptane, 1,7-diethyl-1,4,7-triazaheptane and N,N',N''-trimethyl-1,3,5-triazacyclohexane. Illustrative examples of the tetramine compound include trimethylenetetramine and triethylenetetramine.

Of the above amine compounds, it is preferable to use a monoamine compound of general formula (7). Of these, the use of trimethylamine, triethylamine, tripropylamine, triisopropylamine, tributylamine, triisobutylamine, tri-t-butylamine, dimethylamine, diethylamine, diisopropylamine, diisobutylamine, di-t-butylamine, methylethylamine, methylbutylamine, methylphenylamine, ethylphenylamine, isobutylphenylamine, methylamine, ethylamine, isopropylamine, cyclopropylamine, n-butylamine, isobutylamine, t-butylamine, 2-methylbutylamine, n-hexylamine or phenylamine is more preferred. Further, the use of trimethylamine, triethylamine, tripropylamine, triisopropylamine, tributylamine, triisobutylamine or tri-t-butylamine is especially preferred. These amine compounds may be used singly or two or more may be used in combination.

The aluminum body-forming composition used in this embodiment may additionally include an organic solvent. The organic solvent is not particularly limited, provided it is one which dissolves, and does not react with, the above complex and the subsequently described optionally added ingredients. For example, hydrocarbon solvents, ether solvents and other polar solvents, or halogenated solvents may be used. Examples of hydrocarbon solvents include n-pentane, cyclopentane, n-hexane, cyclohexane, n-heptane, cycloheptane, n-octane, cyclooctane, decane, cyclodecane, hydrogenated dicyclopentadiene, benzene, toluene, xylene, butylbenzene, t-butylbenzene, t-butylxylene, dodecylbenzene, durene, indene, tetrahydronaphthalene, decahydronaphthalene and squalane. Examples of ether solvents include diethyl ether, dipropyl ether, dibutyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, bis(2-methoxyethyl)ether, p-dioxane, anisole, 2-methylanisole, 3-methylanisole, 4-methylanisole, phenetole, 2-methylphenetole, 3-methylphenetole, 4-methylphenetole, veratrole, 2-ethoxyanisole and 1,4-dimethoxybenzene. Examples of other polar solvents include the above-mentioned amine compounds. Among amine compounds, monoamine compounds are preferred. Examples of halogenated solvents include methylene chloride and chloroform.

These organic solvents may be used singly, or two or more may be used in combination.

From the standpoints of both solubility and the stability of the solution formed, the use of a hydrocarbon solvent or the use of a mixed solvent composed of a hydrocarbon solvent and an ether solvent is preferred. In such a case, preferred examples of the hydrocarbon solvent used include n-pentane, cyclopentane, n-hexane, cyclohexane, n-heptane, cycloheptane, n-octane, benzene, toluene, xylene, butylbenzene, t-butylbenzene and t-butylxylene. Preferred examples of the ether solvent used in such a mixed solvent include diethyl ether, dipropyl ether, dibutyl ether, ethylene glycol diethyl ether, ethylene glycol methyl ethyl ether, tetrahydropyran, tetrahydropyran, anisole, 2-methylanisole, 3-methylanisole, 4-methylanisole, phenetole, veratrole, 2-ethoxyanisole and 1,4-dimethoxybenzene.

The aluminum body-forming composition used in this embodiment may optionally include a titanium compound (also referred to below in this specification as a "titanium catalyst"). Illustrative examples of the titanium compound include compounds represented by general formulae (8) and (9) below.

$$Ti(NR^7)_4 \qquad (8)$$

(wherein $R^7$ is an alkyl group or a phenyl group)

$$Ti(Cp)_n(Y)_{4-n} \qquad (9)$$

(wherein Cp is a cyclopentadienyl group, Y is a halogen atom or an alkyl group, and n is an integer from 1 to 4)

Illustrative examples of the titanium compound represented by general formula (8) include tetrakis(dimethylamino)titanium, tetrakis(diethylamino)titanium, tetrakis(di-t-butoxyamino)titanium, tetrakis(di-i-propoxyamino)titanium and tetrakis(diphenylamino)titanium.

Illustrative examples of the titanium compound represented by general formula (9) include dicyclopentadienyltitanium dichloride, dicyclopentadienyltitanium dibromide, cyclopentadienyltitanium trichloride, cyclopentadienyltitanium tribromide, dicyclopentadienyldimethyltitanium, dicyclopentadienyldiethyltitanium, dicyclopentadienyldi-t-butyltitanium, dicyclopentadienylphenyltitanium chloride and dicyclopentadienylmethyltitanium chloride.

Where necessary, the aluminum body-forming composition used in this embodiment may additionally include other aluminum compounds (exclusive of complexes of an amine compound and aluminum hydride; sometimes referred to below as simply "other aluminum compounds").

Illustrative examples of other aluminum compounds include trimethylaluminum, triethylaluminum, tri-n-propylaluminum, tricyclopropylaluminum, tri-n-butylaluminum, tri-isobutylaluminum, tri-t-butylaluminum, tri-2-methylbutylaluminum, tri-n-hexylaluminum, tricyclohexylaluminum, tri (2-ethylhexyl)aluminum, trioctylaluminum, triphenylaluminum, tribenzylaluminum, dimethylphenylaluminum, diethylphenylaluminum, diisobutylphenylaluminum, methyldiphenylaluminum, ethyldiphenylaluminum, isobutyldiphenylaluminum, diethylaluminum hydride, diisobutylaluminum hydride, diphenylaluminum hydride, dimethyl methacryl aluminum, dimethyl(phenylethynyl)aluminum, diphenyl(phenylethynyl)aluminum, a dimethylamine-dimethylaluminum complex, a diethylamine-diethylaluminum complex, a dimethylamine-diethylaluminum complex, a diethylamine-dimethylaluminum complex, a diphenylamine-dimethylaluminum complex and a diphenylamine-diethylaluminum complex.

The concentration of the complex of an amine compound and aluminum hydride included in the aluminum body-forming composition, although not particularly limited, is preferably at least 30 mass % (i.e. weight % or wt %), and more preferably at least 50 mass %, of the overall composition. The above-mentioned hydrocarbon solvents, ether solvents, halogenated solvents and monoamine compounds are preferred as solvents capable of being stably present together with the complex of an amine compound and aluminum hydride. Examples of these compounds are as indicated above.

In cases where the aluminum body-forming composition includes a titanium compound, the concentration of the titanium compound is preferably not more than 1 mol %, more preferably from 0.00001 to 1 mol %, and even more preferably from 0.00005 to 0.01 mol %, based on the combined amount of the complex of an amine compound with aluminum hydride and the titanium compound.

In cases where the aluminum body-forming composition includes the above-described other aluminum compound, the concentration of the other aluminum compound is preferably not more than 5 mass %, more preferably not more than 1 mass %, and even more preferably not more than 0.1 mass %, of the overall composition. At a concentration within this range, particularly when the aluminum body is filled into small gaps, good gap-filling properties are obtained.

As described above, an example of the method of preparing an aluminum body-forming composition is a method that involves synthesizing a complex of an amine compound and aluminum hydride in the presence of a solvent, then removing insoluble by-products with a filter or the like and using the resulting solution directly as the aluminum body-forming composition. Alternatively, after adding the desired solvent to this solution, the solvent that was used in the complex-forming reaction (e.g., diethyl ether) may be removed under reduced pressure and the resulting solution may be used as the aluminum body-forming composition.

In cases where the aluminum body-forming composition contains a titanium compound and/or the above-described other aluminum compound, the composition can be prepared by, for example, adding a solution containing a predetermined amount of the titanium-containing compound and/or the other aluminum compound to a solution containing the complex of an amine compound and aluminum hydride that has been prepared as described above. The temperature during addition is preferably from 0 to 150° C., and more preferably from 5 to 100° C.

[Aluminum Body-Forming Step]

In the aluminum body-forming step, the aluminum body-forming composition is heated, generating a vapor of the complex of an amine compound and aluminum hydride (sometimes referred to below as simply the "complex"). The heating temperature is selected according to the molecular weight and structure of the complex used. The heating temperature is generally from 50 to 150° C., preferably from 50 to 120° C., and more preferably from 60 to 90° C. The heating temperature is lower than the decomposition temperature of the complex that is used. The heating temperature is preferably at least 10° C. lower, more preferably at least 20° C. lower, and even more preferably at least 40° C. lower, than the decomposition temperature of the complex that is used.

The decomposition temperature refers to the temperature at which the complex thermally decomposes in the atmosphere in which the aluminum body-forming step is carried out. The method of determining the decomposition temperature is the same as was explained for the titanium film-forming step. In cases where the aluminum body-forming composition includes an organic solvent or in cases where fluctuation in the base line is large such as when the composition itself has a high volatility, DSC measurement is carried out in a closed system and the exothermic peak detected may be treated as the decomposition temperature of the complex.

Next, the complex vapor that has been generated is brought into contact with the substrate surface. The temperature of the substrate is set so as to be not higher than the heating temperature of the aluminum body-forming composition. The length of time during which the complex vapor and the substrate are contacted is suitably set according to such factors as the type and shape of the substrate and the intended film thickness. This time is generally from 1 to 60 minutes, preferably from 2 to 30 minutes, and more preferably from 3 to 20 minutes. The material making up the substrate is exemplified by the same materials as were mentioned in connection with the first embodiment. Alternatively, as will be subsequently explained, a substrate having on a surface thereof a titanium-containing film that has been formed by any of the methods mentioned in the first embodiment may be used.

The manner in which the aluminum body-forming composition and the substrate are arranged and the construction of the apparatus used are the same as explained above in connection with the titanium film-forming step. A titanium film-forming step and an aluminum body-forming step may be carried out consecutively within the same apparatus.

The aluminum body-forming step is preferably carried out in an inert atmosphere which is, to the extent possible, free of oxygen, or in a reducing atmosphere. An inert atmosphere can be achieved with an inert gas such as nitrogen gas, helium gas or argon gas. A reducing atmosphere can be achieved by mixing such an inert gas with a reducing gas. Examples of reducing gases include hydrogen gas and ammonia gas. In cases where a reducing atmosphere is used, the reducing gas accounts for preferably from 1 to 70 mol %, and more preferably from 3 to 40 mol %, of the combined amount of inert gas and reducing gas.

[Underlying Film-Forming Step]

Prior to the aluminum body-forming step, an underlying film for promoting aluminum body formation may be formed on the substrate. In this specification, "underlying film" is defined as a film which includes at least one type of metal atom selected from the group consisting of titanium, palladium and aluminum. The underlying film can be formed by coating the substrate with a solution containing an organometallic compound that includes these metal atoms (exclusive of a complex of an amine compound and aluminum hydride), and heating. Alternatively, the underlying film may be formed by, as in the above-described titanium film-forming step according to the present invention, bringing the vapor of a complex containing these metal atoms as the central atoms into contact with the substrate surface. In this case, the method according to the invention is carried out at least twice on the same substrate. By forming an underlying layer on the substrate, the formability of a film-like aluminum body on the substrate can be further improved. In cases where the substrate has small gaps, the gap-filling properties of aluminum into the small gaps is improved.

A case in which an underlying film is formed by a method other than the method according to the invention is described. First, examples of the organometallic compound used to form the underlying film are given below.

Example of titanium atom-containing organometallic compounds include the titanium compounds earlier mentioned as being suitable for inclusion in the above-described aluminum body-forming composition.

Example of Palladium atom-containing organometallic compounds include halogen atom-containing palladium complexes such as allylpalladium chloride, dichlorobis(acetonitrile)palladium and dichlorobis(benzonitrile)palladium; acetate compounds of palladium; β-diketone complexes of palladium, such as pentane-2,4-dionatopalladium and hexafluoropentanedionatopalladium; complexes of palladium and a conjugate carbonyl group-containing compound, such as bis(dibenzylideneacetone)palladium; and phosphine-type palladium complexes such as bis[1,2-bis(diphenylphosphino)ethane]palladium, bis(triphenylphosphine)palladium chloride, bis(triphenylphosphine)palladium acetate, diacetate bis(triphenylphosphine)palladium, dichloro[1,2-bis(diphenylphosphine)ethane]palladium, trans-dichlorobis(tricyclohexylphosphine)palladium, trans-dichlorobis(triphenylphosphine)palladium, trans-dichlorobis(tri-o-tolylphosphine)palladium and tetrakis(triphenylphosphine)palladium.

Illustrative examples of the aluminum atom-containing organometallic compounds include aluminum ethoxide, aluminum isopropoxide, aluminum n-butoxide, aluminum s-butoxide, aluminum t-butoxide, aluminum ethoxyethoxyethoxide and aluminum phenoxide; aluminum alkylates such as aluminum acetate, aluminum acrylate, aluminum methacrylate and aluminum cyclohexane butyrate; and β-diketone complexes of aluminum, such as pentane-2,4-diketoaluminum, hexafluoropentane-2,4-diketoaluminum, 2,2,6,6-tetramethylheptane-3,5-diketoaluminum, bis(ethoxybutane-1,3-diketo)aluminum s-butoxide, (ethoxybutane-1,3-diketo) aluminum di-s-butoxide and (ethoxybutane-1,3-diketo) aluminum diisopropoxide.

Of these, titanium isopropoxide, aluminum isopropoxide, bis(ethoxybutane-1,3-diketo)titanium diisopropoxide, tetra(pentane-2,4-diketo)titanium, pentane-2,4-diketopalladium, hexafluoropentane-2,4-diketopalladium, pentane-2,4-diketoaluminum and hexafluoropentane-2,4-diketoaluminum are preferred.

These organometallic compounds containing at least one type of metal atom selected from the group consisting of titanium, palladium and aluminum may be used as a solution. The solvent used in this solution may be any solvent capable of dissolving the organometallic compound. Examples of the solvent include ethers, esters having an ether group, hydrocarbons, alcohols, polar aprotic solvents and mixed solvents thereof. The organometallic compound accounts for preferably from 0.1 to 10 mass %, and more preferably from 0.1 to 5 mass %, of the underlying film-forming composition.

Coating of the underlying film-forming composition onto the substrate can be carried out by a known method such as spin coating, roll coating, curtain coating, dip coating, spraying or droplet discharge. In cases where the substrate has small gaps therein, if the small gaps have an opening width of not more than 300 nm and an aspect ratio of at least 5, placing the substrate under a reduced pressure for a while after the underlying film-forming composition has been coated onto the substrate enables more uniform application of the underlying film-forming composition to the interior of the small gaps. A specific technique is to hold the substrate at a lower pressure (referred to below as the "second pressure") than the pressure when coating the underlying film-forming composition onto the substrate having small gaps (referred to below as the "first pressure"). The second pressure is preferably from 1 to 70%, and more preferably from 10 to 40%, of the first pressure. For example, the second pressure in cases where the pressure during coating is $1.01 \times 10^5$ Pa (atmospheric pressure) is preferably from $1.01 \times 10^3$ to $7.09 \times 10^4$ Pa, and more preferably from $1.01 \times 10^4$ to $4.05 \times 10^4$ Pa. The length of time for which the substrate is held under the second pressure is preferably from 10 seconds to 10 minutes, and more preferably from 10 seconds to 1 minute. After the substrate has been held under the second pressure, it is preferable to return the system to the first pressure using an inert gas and then furnish the substrate to the next heating step. The length of time taken to return the system to the first pressure is preferably from 3 seconds to 5 minutes, and more preferably from 5 seconds to 1 minute. This series of operations may be repeated a plurality of time. From the standpoint of both the uniformity of the film and the ease of carrying out the process, the number of repetitions is preferably not more than 10 times, and more preferably not more than 5 times. The coat thus formed is again heated. The heating temperature is preferably from 30 to 350° C., and more preferably from 40 to 300° C. The heating time is preferably from 5 to 90 minutes, and more preferably from 10 to 60 minutes. The atmosphere during the coating step and the heating step is preferably an inert atmosphere composed of, for example, nitrogen gas, helium gas or argon gas. If necessary, these steps may be carried out in an atmosphere to which has also been added a reducing gas such as hydrogen gas or an oxidizing gas such as oxygen gas. The thickness of the underlying film, expressed as the thickness of the coat after solvent removal, is preferably from 0.001 to 5 μm, and more preferably from 0.005 to 0.5 μm.

An aluminum film having various excellent properties, including reflectance and adhesion to the substrate, can be obtained by the above-described method. In cases where the substrate has small gaps, an aluminum film that has been properly filled into the interior of small gaps having a small opening width and a large aspect ratio can easily be formed. Here, by suitably setting the substrate temperature, the aluminum body can be preferentially or selectively filled into the interior of small gaps having a large aspect ratio.

After the aluminum body-forming step, there may be included a film-like aluminum body-removing step in which excess areas of the film-like aluminum body (e.g., part or all of the film-like aluminum body that was formed from the aluminum body-forming composition, other than the aluminum body-forming composition that was filled into the small gaps) are removed by chemical mechanical planarization or the like. The aluminum body that has been formed can again be heated. By again heating the aluminum body that has been formed, the strength and adhesion of the film are improved. When heating again, the heating temperature and heating time are adjusted according to the intended purpose. For example, the temperature may be set to from 300 to 400° C. and the time may be set to from 1 to 10 minutes. From the standpoint of productivity and energy savings, a lower temperature and a shorter time are preferred.

EXAMPLES

The invention is illustrated more concretely below by way of examples. Unless noted otherwise, the following operations were all carried in a dry nitrogen gas atmosphere. The solvents used were all solvents that were dewatered beforehand with a Molecular Sieve 4A (manufactured by Union Showa KK), deaerated by bubbling with nitrogen gas, and distilled. The methods used to analyze and measure the resulting films are indicated below.

[Composition Identification]

The composition was determined with an ESCA analyzer (AXIS Ultra DLD, from Kratos Analytical).

[Reflectance (%)]

The reflectance was measured in the 700 nm wavelength region with a spectrophotometer (U-4100, from Hitachi High-Technologies Corporation).

[Film Thickness (nm)]

The film thickness was measured with a grazing incidence x-ray diffractometer (X'Pert MRD, from Philips).

[Resistivity ($\mu\Omega \cdot cm$)]

The resistivity was measured with a probe-type resistivity measuring instrument (RT-80/RG-80, from Napson Corporation).

Preparation Example 1

Preparation of Titanium Compound (Titanium Catalyst)-Containing Solution

Cyclopentadienyltitanium trichloride (0.11 g) was placed in a 30 mL glass vessel. t-Butylbenzene was added, bringing the total weight up to 25.00 g. The mixture was thoroughly stirred, then left at rest for 4 hours at room temperature. The mixture was then filtered using a polytetrafluoroethylene membrane filter having a pore size of 0.1 µm (manufactured by Whatman Inc.), thereby obtaining a solution containing 20 µmol/g of cyclopentadienyltitanium trichloride.

Preparation Example 2

Preparation of Titanium-Containing Film-Forming Composition (1)

Poly(dibutyltitanate) (0.19 g) was placed in a 20 mL glass vessel. Propylene glycol monomethyl ether was added, bringing the total weight to 19.00 g. The mixture was thoroughly stirred, then left at rest for 2 hours at room temperature. This was filtered using a polytetrafluoroethylene membrane filter having a pore size of 0.1 µm (manufactured by Whatman Inc.), thereby obtaining Titanium-Containing Film-Forming Composition (1).

Preparation Example 3

Preparation of Complex (1) of an Amine Compound and Aluminum Hydride

Lithium aluminum hydride (3.80 g) was placed in a 200 mL three-neck flask containing a magnetic stirrer. The three connection ports on the three-neck flask were fitted with, respectively, a 100 mL powder addition funnel, a glass stopper and a vacuum adapter with three-way stopcock connected to a nitrogen line. After dimethylethylamine hydrochloride (17.80 g) was placed in the powder addition funnel, the interior of the three-neck flask was replaced with nitrogen via the vacuum adapter with three-way stopcock. Next, 100 mL of hexane was added to the three-neck flask using a glass syringe. Triethylamine hydrochloride was gradually added to the three-neck flask over a period of 10 minutes while stirring the flask contents with a magnetic stirrer at a stirring rate of 1,000 rpm. Following the completion of addition, stirring was continued for 2 hours. Next, the reaction mixture was removed from the flask and delivered by pressure to another vessel using a polytetrafluoroethylene tube packed at the tip with absorbent cotton (absorbent cotton as specified in the Pharmacopoeia of Japan). The reaction mixture was filtered using a polytetrafluoroethylene membrane filter having a pore size of 0.1 µm (manufactured by Whatman Inc.). The filtrate was recovered in a 300 mL round-bottomed flask. After filtration was complete, a magnetic stirrer was placed in the above 300 mL round-bottomed flask and a vacuum adapter with three-way stopcock was fitted thereto. This vacuum adapter with three-way stopcock was connected to a vacuum pump through a trap. The solvent was vacuum distilled away under stirring at a rate of 300 rpm with the magnetic stirrer. Following solvent removal, the remaining material was filtered using a polytetrafluoroethylene membrane filter having a pore size of 0.1 µm (manufactured by Whatman Inc.), giving 9.40 g of Complex (1) of triethylamine and aluminum hydride as a clear, colorless liquid (yield, 60%).

Preparation Example 4

Preparation of Complex (2) of an Amine Compound and Aluminum Hydride

Aside from using 17.80 g of triethylamine hydrochloride instead of 17.80 g of dimethylethylamine hydrochloride, a complex of an amine compound and aluminum hydride was prepared in the same way as in Preparation Example 3. This gave 10.25 g of Complex (2) of triethylamine and aluminum hydride as a clear, colorless liquid (yield, 55%).

Preparation Example 5

Preparation of Complex (3) of an Amine Compound and Aluminum Hydride

Aside from using 25.5 g of tripropylamine hydrochloride instead of 17.80 g of triethylamine hydrochloride, a complex of an amine compound and aluminum hydride was prepared in the same way as in Preparation Example 4. This gave 11.25 g of Complex (3) of tripropylamine and aluminum hydride as a clear, colorless liquid (yield, 65%).

Preparation Example 6

Preparation of Titanium-Containing Film-Forming Composition (2)

Tetrakis(dimethylamino)titanium (manufactured by Aldrich; 0.19 g) was placed in a 20 mL glass vessel. Dibutyl ether was added, bringing the total weight up to 19.00 g. The mixture was thoroughly stirred, then left at rest for 2 hours at room temperature. The mixture was then filtered using a polytetrafluoroethylene membrane filter having a pore size of 0.1 µm (manufactured by Whatman Inc.), giving Titanium-Containing Film-Forming Composition (2).

The structures of the complexes of amine compounds and aluminum hydride obtained in Preparation Examples 3 to 5 each were determined using an $^1$H-NMR spectrometer (Avance 500, from Bruker; resolution, 500 MHz). The decomposition temperatures of the complexes of amine compounds and aluminum hydride obtained in Preparation Examples 3 to 0.5 and of tetrakis(dimethylamino)titanium were determined by DSC and TG/DTA. The measurement results are shown in Table 1. The DSC and TG/DTA measurement conditions and the methods for determining the decomposition temperatures are shown below.

[DSC Measurement Conditions]
Instrument: DSC 6220 (manufactured by SII Nanotechnology Inc.)
Sample size: about 6 mg
Vessel: stainless steel pan
Reference sample: metallic indium (during calibration)
Temperature ramp-up conditions: 40° C.→10° C./min→300° C.
Ambient gas: nitrogen

[TG/DTA. Measurement Conditions]
Instrument: Thermo Plus2 TG8120 (manufactured by Rigaku Corporation)
Sample size: about 10 mg
Vessel: deep pan made of aluminum (diameter, 5 mm; depth, 2 mm)
Reference sample: $Al_2O_3$
Temperature ramp-up conditions: 20° C.→10° C./min→480° C.
Gas: nitrogen (200 mL/min)

[Method for Determining Decomposition Temperature]
As a rule, the decomposition temperature was determined from a chart obtained by TG/DTA measurement. Specifically, the intersection between a tangent at the inflection point in the exothermic peak detected and a tangent at the base line on the low-temperature side of the exothermic peak was treated as the decomposition temperature. However, in cases where there were large fluctuations in the baseline or two or more exothermic peaks were detected, the exothermic peak detected in DSC measurement was used as the reference for determining the decomposition temperature. When only one peak was detected in DSC measurement, the closest peak thereto was treated as the exothermic peak due to decomposition of the complex; when two or more peaks were detected in DSC measurement, the largest of the exothermic peaks detected in TG/DTA measurement was treated as the exothermic peak due to decomposition of the complex.

Example 1

A 4-inch diameter silicon substrate having a 10 nm thick titanium nitride film on one surface and a dish-shaped stainless steel vessel (inside diameter, 1 cm; depth, 0.5 cm) in which had been placed 0.3 g of the Complex (1) of an amine compound and aluminum hydride obtained in Preparation Example 3 were prepared for use. These were placed in a glovebox filled with dry nitrogen gas (high-purity nitrogen gas at a flow rate of 100 sccm; chamber pressure=positive pressure of 0.5 kPa). A stainless steel lid (inside diameter, 20 cm; height, 4 cm) was placed on top so as to cover both the substrate and the dish-shaped stainless steel vessel. The substrate was heated to 75° C., in addition to which the dish-shaped stainless steel vessel was heated at 75° C. The temperature was held in this state for 5 minutes, after which heating of the substrate and the dish-shaped stainless steel vessel was stopped. When the stainless steel lid was removed, the surface of the substrate was covered with a film having a silvery-white metallic luster. The ESCA spectrum of the resulting film was examined, whereupon a peak attributable to $Al_{2p}$ was observed at 73.5 eV, confirming this film to be an aluminum film. The reflectance at a wavelength of 700 nm was 75%. This film was found by grazing incidence x-ray diffractometry to have a thickness of 350 nm. The resistivity of the aluminum film was measured at 5 points in the radial direction by the four-probe method, whereupon the resistivity was 4.0 µΩ·cm and the in-plane uniformity was 6%. The results are shown in Table 2.

Example 2

A silicon substrate like that in Example 1 was mounted on a spin coater. Next, 1 mL of Titanium-Containing Film-Forming Composition (1) prepared in Preparation Example 2 was dripped onto the titanium nitride film-bearing side of the substrate while spinning the substrate for 10 seconds at a speed of 2,000 rpm in a nitrogen gas atmosphere. This substrate was then placed on a hot plate set to 150° C. and heated for 10 minutes. The underlying film that was formed had a thickness of 2 nm. This substrate and a dish-shaped stainless steel vessel (inside diameter, 1 cm; depth, 0.5 cm) in which had been placed 0.3 g of Complex (1) were placed in a glovebox filled with dry nitrogen gas (high-purity nitrogen

TABLE 1

Figure 2:
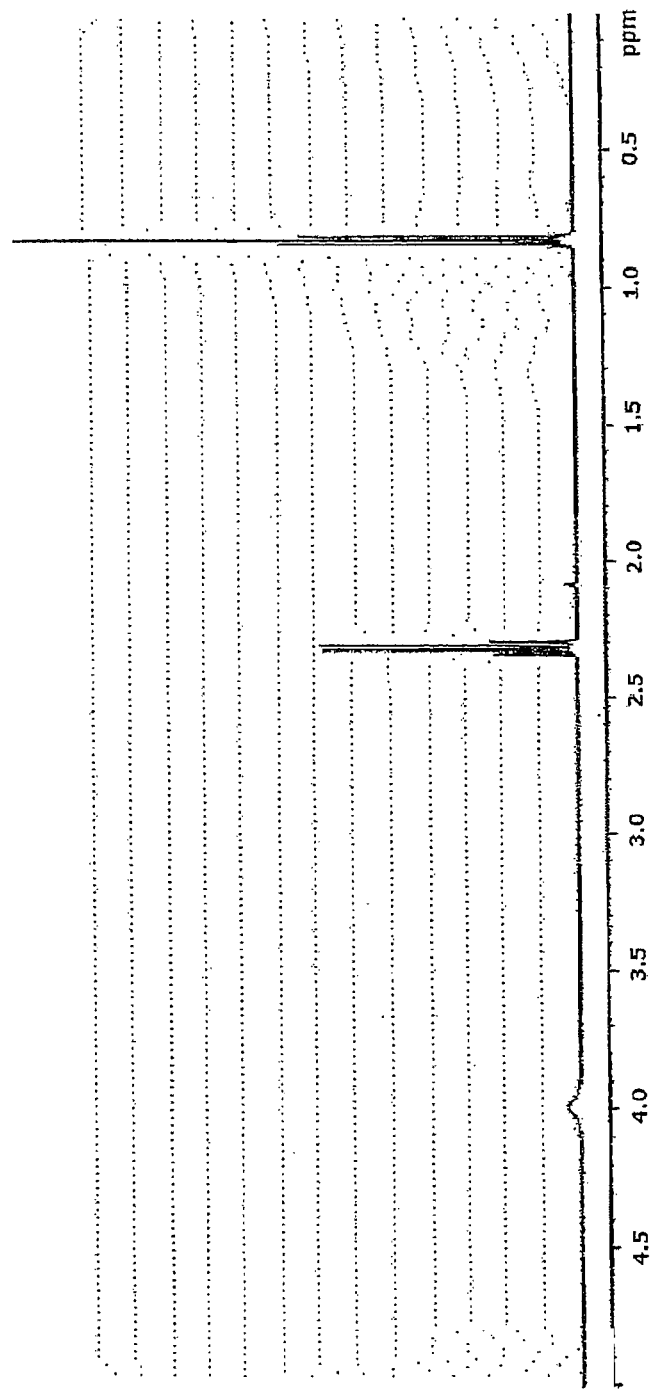
FIG. 2 shows an $^1$H-NMR spectrum for the complex of an amine compound and aluminum hydride obtained in Preparation Example 4.
Figure 3:
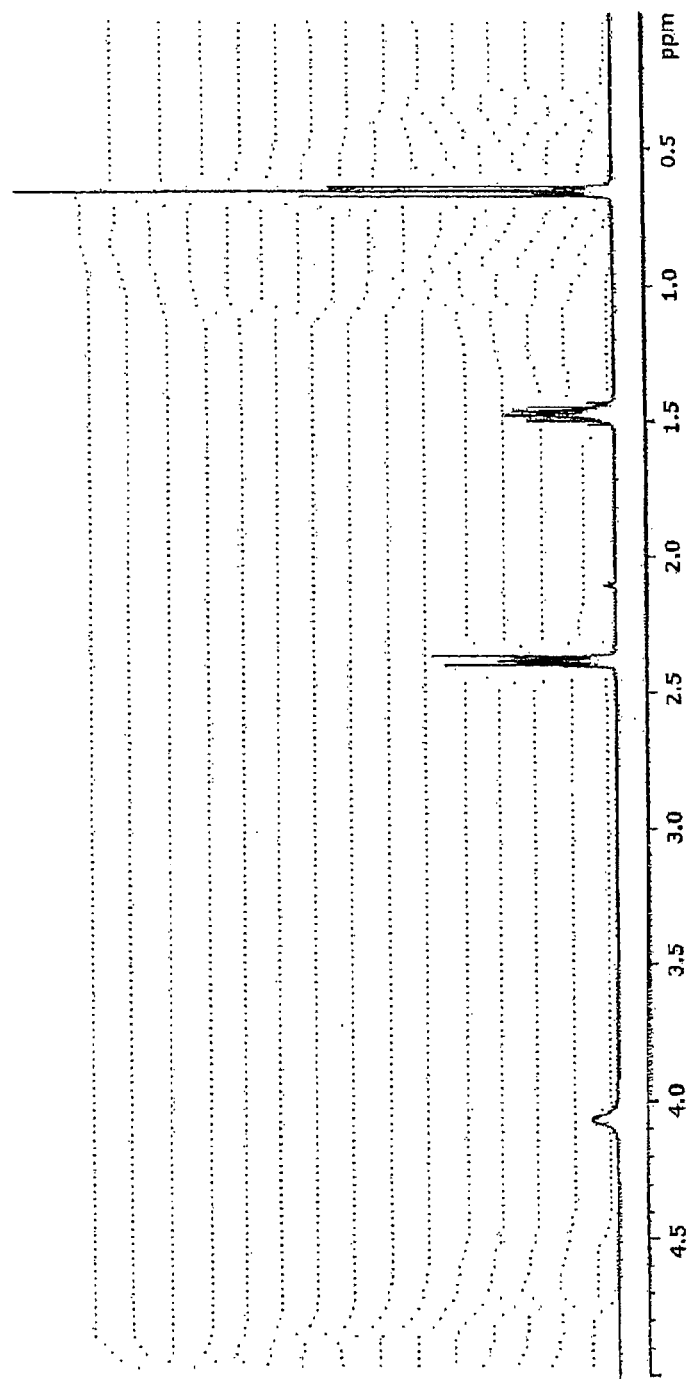
FIG. 3 shows an $^1$H-NMR spectrum for the complex of an amine compound and aluminum hydride obtained in Preparation Example 5.
Figure 4:
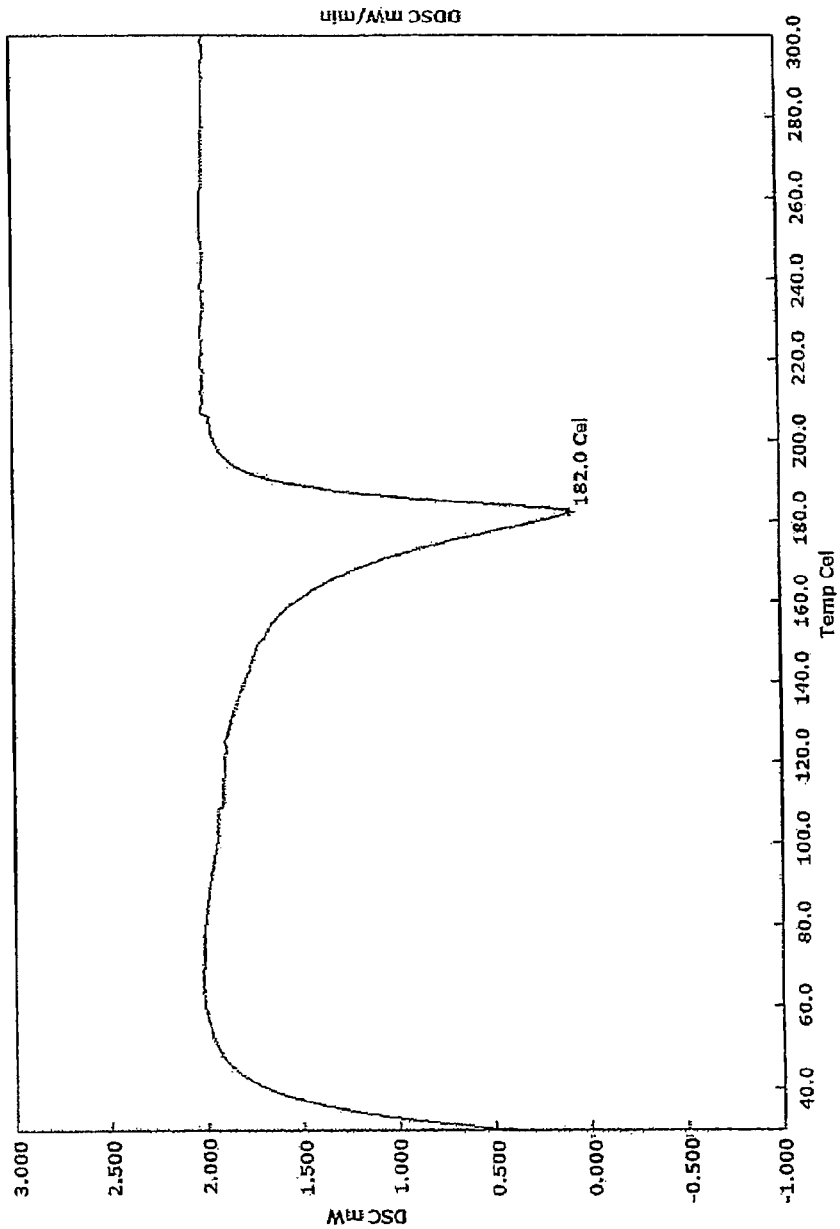
FIG. 4 shows a DSC chart for the complex of an amine compound and aluminum hydride obtained in Preparation Example 3.
Figure 5:
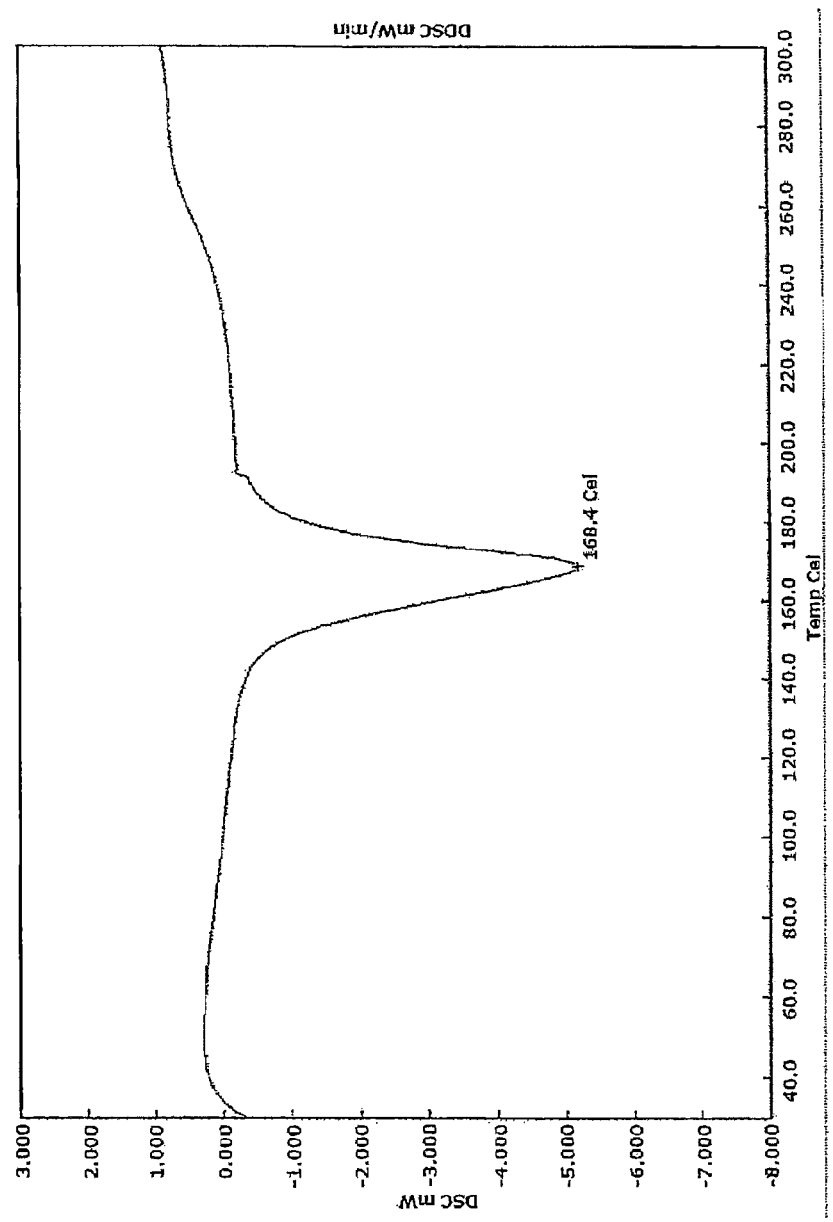
FIG. 5 shows a DSC chart for the complex of an amine compound and aluminum hydride obtained in Preparation Example 4.
Figure 6:
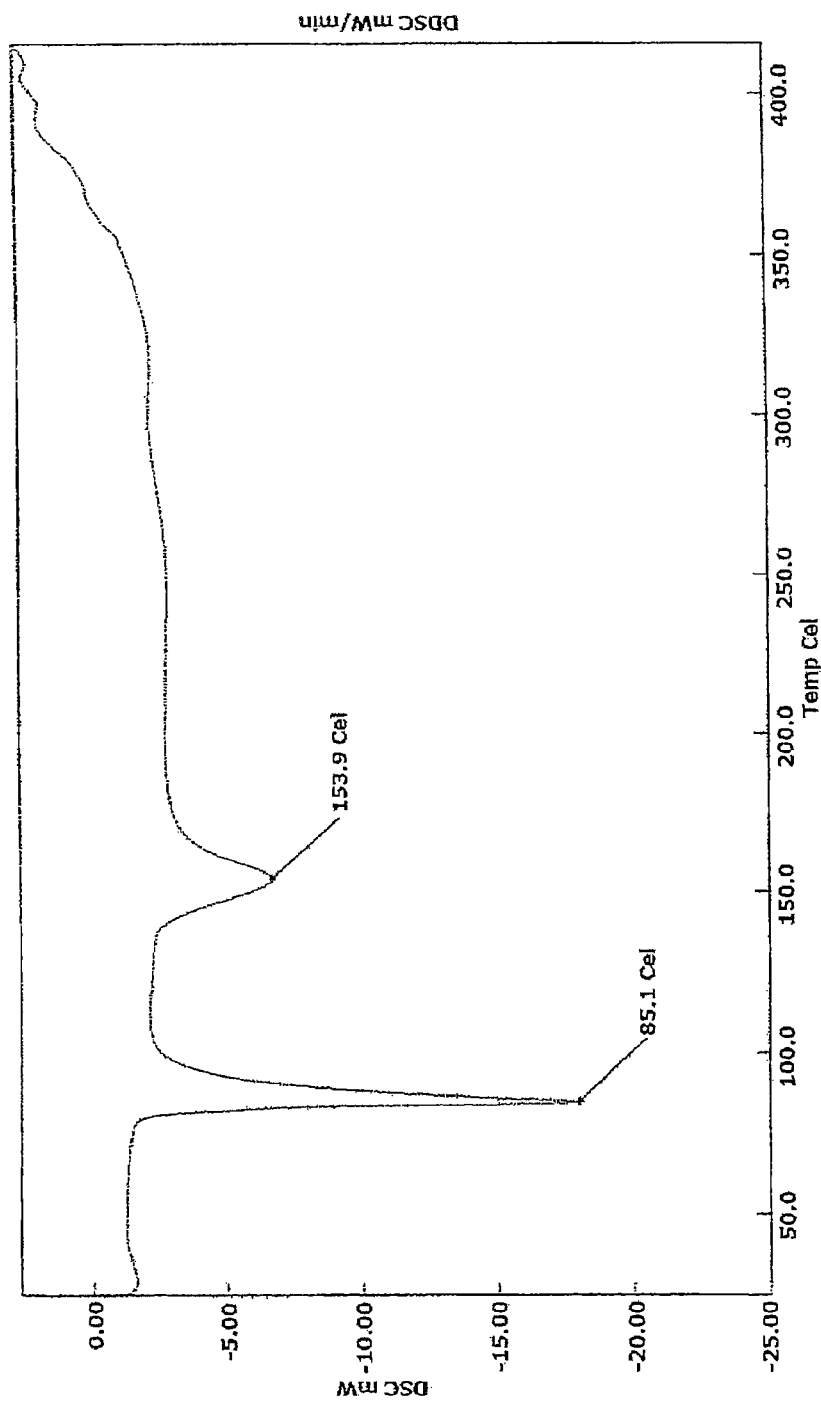
FIG. 6 shows a DSC chart for the complex of an amine compound and aluminum hydride obtained in Preparation Example 5.
Figure 7:
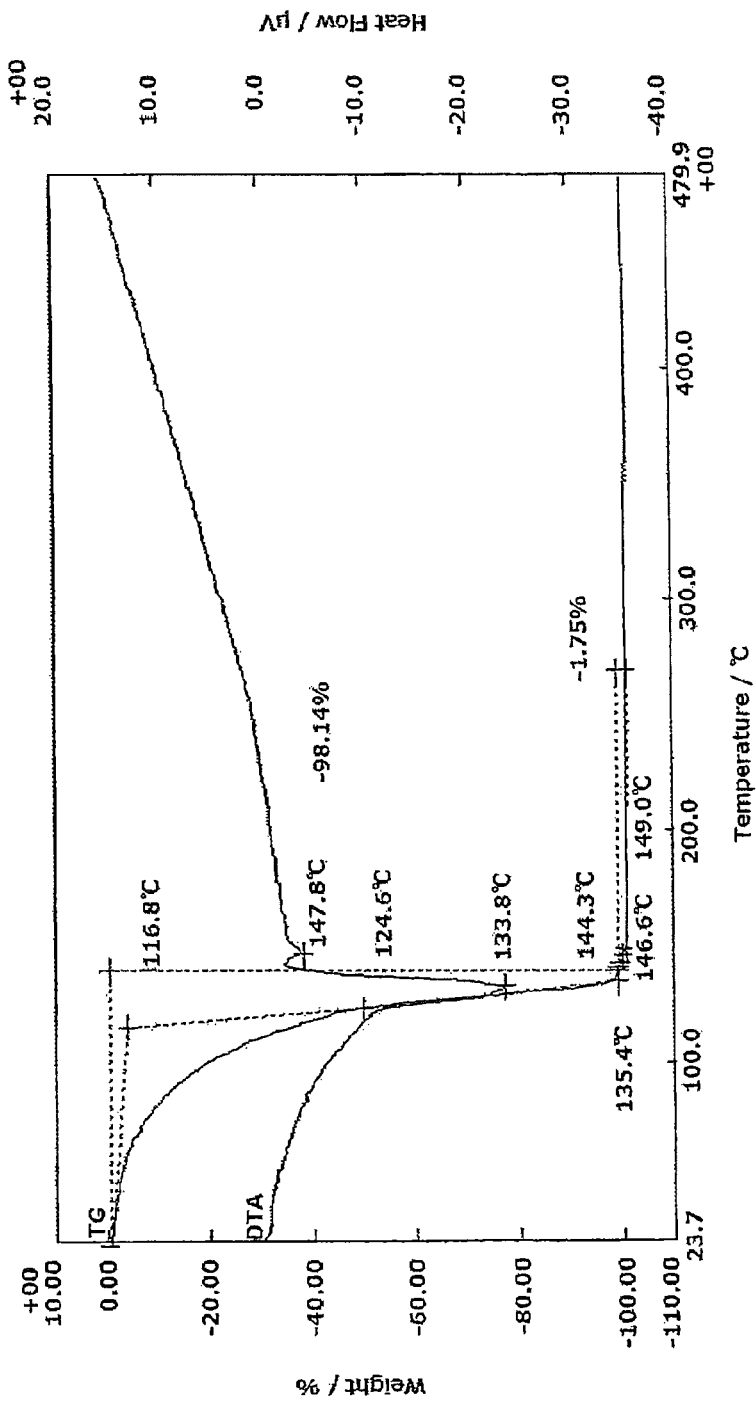
FIG. 7 shows a TG/DTA chart for the complex of an amine compound and aluminum hydride obtained in Preparation Example 3.
Figure 8:
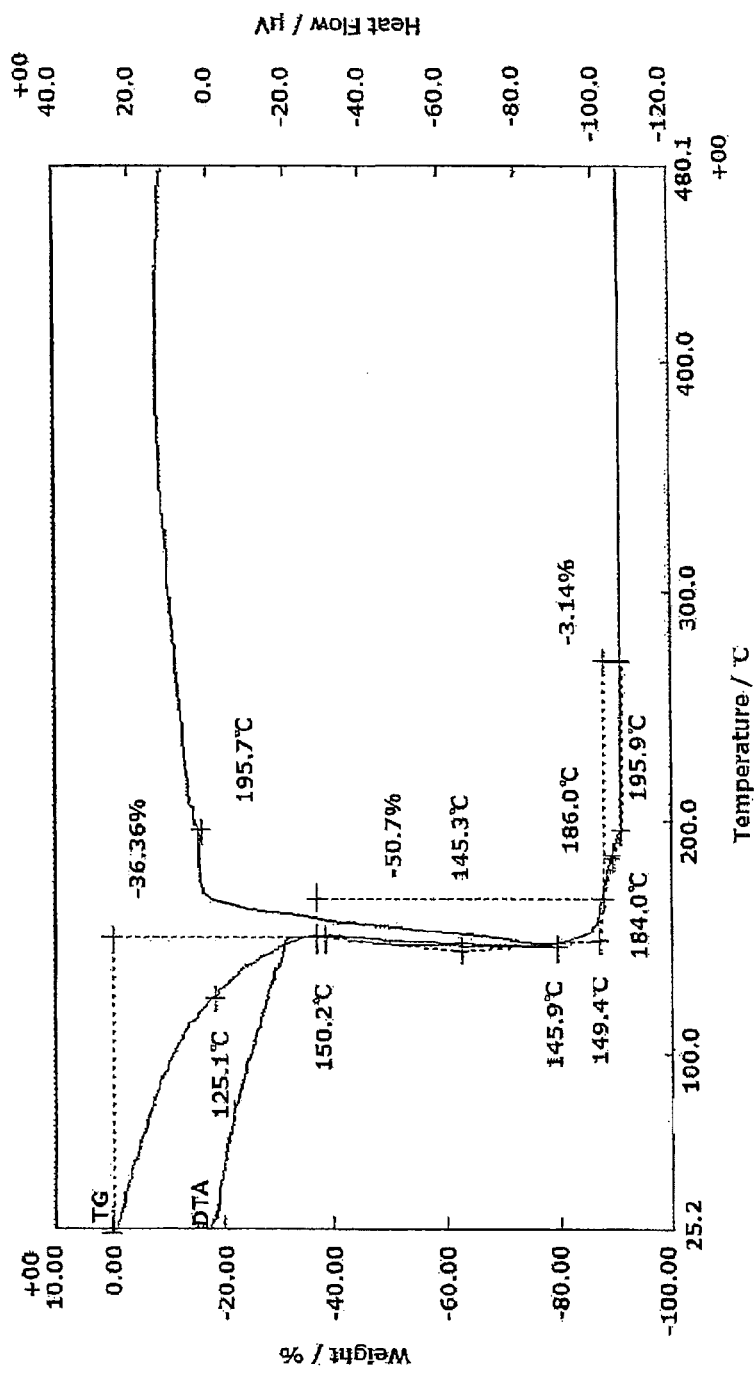
FIG. 8 shows a TG/DTA chart for the complex of an amine compound and aluminum hydride obtained in Preparation Example 4.
Figure 9:
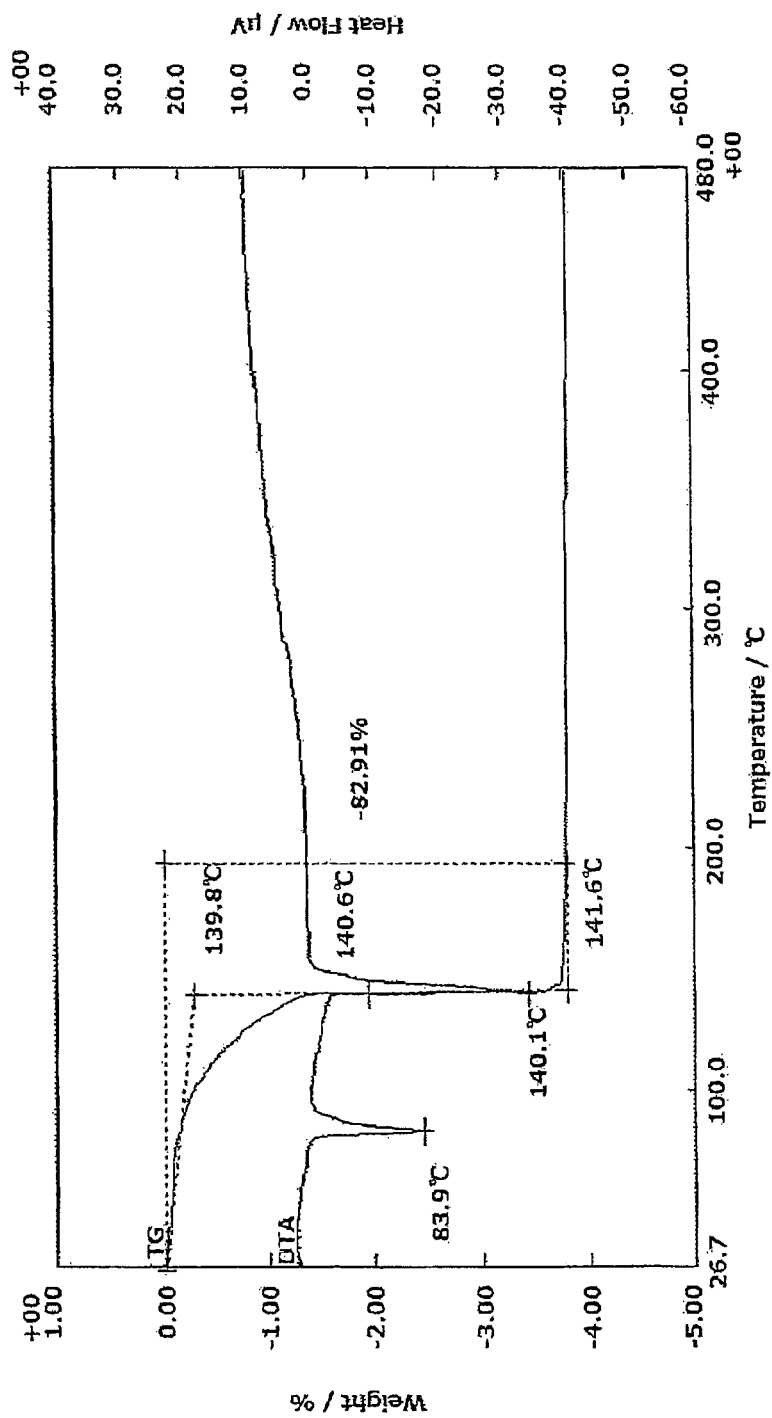
FIG. 9 shows a TG/DTA chart for the complex of an amine compound and aluminum hydride obtained in Preparation Example 5.

| Preparation example | Amine compound/ aluminum hydride complex | Amine | $^1$H-NMR | DSC | TG/DTA | Decomposition temperature (° C.) |
|---|---|---|---|---|---|---|
| 3 | Complex (1) | Et(Me)$_2$N | FIG. 1 | FIG. 4 | FIG. 7 | 117 |
| 4 | Complex (2) | Et$_3$N | FIG. 2 | FIG. 5 | FIG. 8 | 125 |
| 5 | Complex (3) | Pr$_3$N | FIG. 3 | FIG. 6 | FIG. 9 | 140 |

The decomposition temperature of tetrakis(dimethylamino)titanium was determined in the same way, and found to be 110° C.

gas at a flow rate of 100 sccm; chamber pressure=positive pressure of 0.5 kPa). A stainless steel lid (inside diameter, 20 cm; height, 4 cm) was placed on top so as to cover both the substrate and the dish-shaped stainless steel vessel. The substrate was heated to 75° C., and the dish-shaped stainless steel vessel was heated at 75° C. The temperature was held for 5 minutes in this state, after which heating of the substrate and the dish-shaped stainless steel vessel was stopped. When the stainless steel lid was removed, the surface of the substrate was covered with a film having a silvery-white metallic luster. The ESCA spectrum of the resulting film was examined, whereupon a peak attributable to $Al_{2p}$ was observed at 73.5 eV, confirming this film to be an aluminum film. The reflectance at a wavelength of 700 nm was 80%. This film was found from grazing incidence x-ray diffractometry to have a thickness of 400 nm. The resistivity of the aluminum film was measured at 5 points in the radial direction by the four-probe method, whereupon the resistivity was 3.8 μΩ·cm and the in-plane uniformity was 4%. The results are shown in Table 2.

Example 3

A 4-inch diameter silicon substrate having a 10 nm thick titanium nitride film on one surface and a dish-shaped stainless steel vessel (inside diameter, 1 cm; depth, 0.5 cm) in which had been placed 0.3 g of tetrakis(dimethylamino)titanium were prepared for use. These were placed in a glovebox filled with dry nitrogen gas (high-purity nitrogen gas at a flow rate of 100 sccm; chamber pressure=positive pressure of 0.5 kPa). A stainless steel lid (inside diameter, 20 cm; height, 4 cm) was placed on top so as to cover both the substrate and the dish-shaped stainless steel vessel. The substrate was heated to 100° C., and the dish-shaped stainless steel vessel was heated at 100° C. The temperature was held in this state for 1 minute, after which heating of the substrate and the dish-shaped stainless steel vessel was stopped. The stainless steel lid was removed. An underlying film having a thickness of 1 nm was formed on the surface of the substrate. The substrate on which the underlying film had been formed and a dish-shaped stainless steel vessel (inside diameter, 1 cm; depth, 0.5 cm) in which 0.3 g of Complex (1) had been placed were introduced into a glovebox filled with dry nitrogen gas (high-purity nitrogen gas at a flow rate of 100 scorn; chamber pressure=positive pressure of 0.5 kPa). A stainless steel lid (inside diameter, 20 cm; height, 4 cm) was placed on top so as to cover both the substrate and the dish-shaped stainless steel vessel. The substrate was heated to 75° C., and the dish-shaped stainless steel vessel containing Complex (1) was heated at 75° C. The temperature was held in this state for 5 minutes, after which heating of the substrate and the dish-shaped stainless steel vessel was stopped. When the stainless steel lid was removed, the surface of the substrate was covered with a film having a silvery-white metallic luster. The ESCA spectrum of the resulting film was examined, whereupon a peak attributable to $Al_{2p}$ was observed at 73.5 eV, confirming this film to be an aluminum film. The reflectance at a wavelength of 700 nm was 84%. This film was found from grazing incidence x-ray diffractometry to have a thickness of 410 nm. The resistivity of the aluminum film was measured at 5 points in the radial direction by the four-probe method, whereupon the resistivity was 3.6 μΩ·cm and the in-plane uniformity was 2%. The results are shown in Table 2.

Example 4

First, 0.3 g of tetrakis(dimethylamino)titanium was transferred to a quartz boat and set in a quartz reactor in a nitrogen gas atmosphere. A 4-inch diameter silicon substrate having a 10 nm thick titanium nitride film on one surface was placed near the downstream side of the gas stream within the reactor. Nitrogen gas was passed through the reactor at a flow rate of 300 mL/min for 20 minutes at room temperature. Next, the flow rate of nitrogen gas was set to 100 mL/min and the pressure at the interior of the reactor was lowered to 1330 Pa. The reactor was heated to 50° C. and held at that temperature for 1 minute. Next, pressure reduction was stopped, nitrogen gas was let in, and the pressure within the reactor was returned to atmospheric pressure. An underlying film having a thickness of 1 nm was formed on the substrate. The substrate on which an underlying film having a thickness of 1 nm had been formed and a dish-shaped stainless steel vessel (inside diameter, 1 cm; depth, 0.5 cm) in which had been placed 0.3 g of Complex (1) were placed in a glovebox filled with dry nitrogen gas (high-purity nitrogen gas at a flow rate of 100 sccm; chamber pressure=positive pressure of 0.5 kPa). A stainless steel lid (inside diameter, 20 cm; height, 4 cm) was placed on top so as to cover both the substrate and the dish-shaped stainless steel vessel. The substrate was heated to 75° C., and the dish-shaped stainless steel vessel was heated at 75° C. The temperature was held in this state for 5 minutes, after which heating of the substrate and the dish-shaped stainless steel vessel was stopped. When the stainless steel lid was removed, the surface of the substrate was covered with a film having a silvery-white metallic luster. The ESCA spectrum of the resulting film was examined, whereupon a peak attributable to $Al_{2p}$ was observed at 73.5 eV, confirming this film to be an aluminum film. The reflectance at a wavelength of 700 nm was 82%. This film was found from grazing incidence x-ray diffractometry to have a thickness of 400 nm. The resistivity of the aluminum film was measured at 5 points in the radial direction by the four-probe method, whereupon the resistivity was 3.6 μΩ·cm and the in-plane uniformity was 2%. The results are shown in Table 2.

Example 5

A 4-inch diameter silicon substrate having a 10 nm thick titanium nitride film on one surface and a dish-shaped stainless steel vessel (inside diameter, 1 cm; depth, 0.5 cm) in which had been placed 0.3 g of tetrakis(dimethylamino)titanium were prepared for use. These were placed in a glovebox filled with dry nitrogen gas (high-purity nitrogen gas at a flow rate of 100 sccm; chamber pressure=positive pressure of 0.5 kPa). A stainless steel lid (inside diameter, 20 cm; height, 4 cm) was placed on top so as to cover both the substrate and the dish-shaped stainless steel vessel. The substrate was heated to 100° C., and the dish-shaped stainless steel vessel containing tetrakis(dimethylamino)titanium was heated at 100° C. The temperature was held in this state for 1 minute, after which heating of the substrate and the dish-shaped stainless steel vessel was stopped. When the stainless steel lid was removed, an underlying film having a thickness of 1 nm was formed on the surface of the substrate. The substrate on which the underlying film had been formed and a dish-shaped stainless steel vessel (inside diameter, 1 cm; depth, 0.5 cm) in which 0.3 g of Complex (1) had been placed were placed in a glovebox filled with dry nitrogen gas (high-purity nitrogen gas at a flow rate of 100 sccm; chamber pressure=positive pressure of 0.5 kPa). The Complex (1) was transferred to a quartz boat-like vessel within nitrogen gas, and set in a quartz reactor. The substrate was placed near the downstream side of the gas stream within the reactor, and nitrogen gas was passed through the reactor at a flow rate of 300 mL/min for 20 minutes at room temperature. Next, the flow rate of nitrogen gas was set to 100 mL/min, and the pressure at the interior of the reactor was lowered to 1330 Pa. The reactor was heated to 50° C. and held at that temperature for 5 minutes. Next, pressure reduction was stopped, nitrogen gas was let in, and the pressure within the reactor was returned to atmospheric pressure. The surface of the substrate was covered with a film having a silvery-white metallic luster. The ESCA spectrum of the resulting film was examined, whereupon a peak attributable to $Al_{2p}$ was observed at 73.5 eV, confirming this film to be an aluminum film. The reflectance at a wavelength of 700 nm was 80%. This film was found from grazing incidence x-ray diffractometry to have a thickness of 420 nm. The resistivity of the aluminum film was measured at 5 points in the radial direction by the four-probe method, whereupon the resistivity was 3.8 μΩ·cm and the in-plane uniformity was 2%. The results are shown in Table 2.

Example 6

A 4-inch diameter silicon substrate having a 10 nm thick titanium nitride film on one surface and a dish-shaped stainless steel vessel (inside diameter, 1 cm; depth, 0.5 cm) in which had been placed 0.3 g of Complex (1) were prepared for use. These were placed in a glovebox filled with dry nitrogen gas (high-purity nitrogen gas at a flow rate of 100 sccm; chamber pressure=positive pressure of 0.5 kPa). A stainless steel lid (inside diameter, 20 cm; height, 4 cm) was placed on top so as to cover both the substrate and the dish-shaped stainless steel vessel. The substrate was heated to 150° C., and the dish-shaped stainless steel vessel containing Complex (1) was heated at 150° C. The temperature was held in this state for 5 minutes, after which heating of the substrate and the dish-shaped stainless steel vessel was stopped. When the stainless steel lid was removed, the surface of the substrate was covered with a film having a silvery-white metallic luster. The ESCA spectrum of the resulting film was examined, whereupon a peak attributable to $Al_{2p}$ was observed at 73.5 eV, confirming this film to be an aluminum film. The reflec-tance at a wavelength of 700 nm was 80%. This film was found from grazing incidence x-ray diffractometry to have a thickness of 400 nm. The resistivity of the aluminum film was measured at 5 points in the radial direction by the four-probe method, whereupon the resistivity was 3.6 μΩ·cm and the in-plane uniformity was 5%. The results are shown in Table 2.

Example 7

Aside from using 0.3 g of Complex (2) of an amine compound and aluminum hydride obtained in Preparation Example 4 instead of Complex (1), an aluminum film was formed in the same way as in Example 1. The ESCA spectrum of the resulting film was examined, whereupon a peak attributable to $Al_{2p}$ was observed at 73.5 eV, confirming this film to be an aluminum film. The reflectance at a wavelength of 700 nm was 70%. This film was found from grazing incidence x-ray diffractometry to have a thickness of 250 nm. The resistivity of the aluminum film was measured by the four-probe method, whereupon the resistivity was 4.4 μΩ·cm. The results are shown in Table 2.

Example 8

Aside from using 0.3 g of Complex (2) instead of Complex (1), an aluminum film was formed in the same way as in Example 2. The ESCA spectrum of the resulting film was examined, whereupon a peak attributable to $Al_{2p}$ was observed at 73.5 eV, confirming this film to be an aluminum film. The reflectance at a wavelength of 700 nm was 75%. This film was found from grazing incidence x-ray diffractometry to have a thickness of 290 nm. The resistivity of the aluminum film was measured by the four-probe method, whereupon the resistivity was 4.2 μΩ·cm. The results are shown in Table 2.

Example 9

A 4-inch diameter silicon substrate having a 10 nm thick titanium nitride film on one surface and a dish-shaped stainless steel vessel (inside diameter, 1 cm; depth, 0.5 cm) in which had been placed 0.3 g of the Complex (3) of an amine compound and aluminum hydride obtained in Preparation Example 5 were prepared for use. These were placed in a glovebox filled with dry nitrogen gas (high-purity nitrogen gas at a flow rate of 100 sccm; chamber pressure=positive pressure of 0.5 kPa). A stainless steel lid (inside diameter, 20 cm; height, 4 cm) was placed on top so as to cover both the substrate and the dish-shaped stainless steel vessel. The substrate was heated to 85° C., and the dish-shaped stainless steel vessel was heated at 85° C. The temperature was held in this state for 5 minutes, after which heating was stopped. When the stainless steel lid was removed, the surface of the substrate was covered with a film having a silvery-white metallic luster. The ESCA spectrum of the resulting film was examined, whereupon a peak attributable to $Al_{2p}$ was observed at 73.5 eV, confirming this film to be an aluminum film. The reflectance at a wavelength of 700 nm was 70%. This film was found from grazing incidence x-ray diffractometry to have a thickness of 250 nm. The resistivity of the aluminum film was measured by the four-probe method, whereupon the resistivity was 4.4 μΩ·cm. The results are shown in Table 2.

Example 10

An underlying film was formed on a substrate in the same way as in Example 2. Aside from using 0.3 g of the Complex (3) of an amine compound and aluminum hydride obtained in Preparation Example 5 instead of Complex (2), a substrate and a dish-shaped stainless steel vessel were prepared for use in the same way as in Example 2. A stainless steel lid was placed on top so as to cover both the substrate and the dish-shaped stainless steel vessel in the same way as in Example 2. The substrate was heated to 85° C., and the dish-shaped stainless steel vessel containing Complex (3) was heated at 85° C. The temperature was held in this state for 5 minutes, after which heating was stopped. When the stainless steel lid was removed, the surface of the substrate was covered with a film having a silvery-white metallic luster. The ESCA spectrum of the resulting film was examined, whereupon a peak attributable to $Al_{2p}$ was observed at 73.5 eV, confirming this film to be an aluminum film. The reflectance at a wavelength of 700 nm was 79%. This film was found from grazing incidence x-ray diffractometry to have a thickness of 280 nm. The resistivity of the aluminum film was measured by the four-probe method, whereupon the resistivity was 4.1 μΩ·cm. The results are shown in Table 2.

Example 11

Aside from using a mixture of 0.20 g of Complex (1) of an amine compound and aluminum hydride obtained in Preparation Example 3 with 0.20 g of dried t-butylbenzene instead of 0.3 g of Complex (1), an aluminum film was formed in the same way as in Example 1. The ESCA spectrum of the resulting film was examined, whereupon a peak attributable to $Al_{2p}$ was observed at 73.5 eV, confirming this film to be an aluminum film. The reflectance at a wavelength of 700 nm was 75%. This film was found from grazing incidence x-ray diffractometry to have a thickness of 330 nm. The resistivity of the aluminum film was measured by the four-probe method, whereupon the resistivity was 4.1 μΩ·cm. The results are shown in Table 2.

Example 12

Aside from preparing for use, as the substrate on which an aluminum film is to be formed, a 4-inch diameter silicon substrate having a 10 nm thick tantalum nitride film on one surface instead of a substrate having a titanium nitride film, an aluminum film was formed in the same way as in Example 1. The ESCA spectrum of the resulting film was examined, whereupon a peak attributable to $Al_{2p}$ was observed at 73.5 eV, confirming this film to be an aluminum film. The reflectance at a wavelength of 700 nm was 75%. This film was found from grazing incidence x-ray diffractometry to have a thickness of 350 nm. The resistivity of the aluminum film was measured by the four-probe method, whereupon the resistivity was 4.0 μΩ·cm. The results are shown in Table 2.

Example 13

(13-1) Plasma Treatment

The substrate was subjected to plasma treatment using a plasma CVD system manufactured by Applied Materials (model: Producer SE 3 Twin; BLOk chamber unit). A 4-inch diameter silicon substrate having a 10 nm thick titanium nitride film on one surface was prepared for use as the substrate on which an aluminum film is to be formed. This was placed in the chamber of the above-described plasma treatment system and 20 seconds of plasma treatment was carried out under reduced pressure (a chamber pressure of 400 Pa), an electrode temperature of 335° C. and an electrode output of 100 W, while passing through high-purity argon gas at a flow rate of 400 sccm.

(13-2) Formation of Aluminum Film

Aside from using the substrate treated in 13-1 above, an aluminum film was formed in the same way as in Example 1. The ESCA spectrum of the resulting film was examined, whereupon a peak attributable to $Al_{2p}$ was observed at 73.5 eV, confirming this film to be an aluminum film. The reflectance at a wavelength of 700 nm was 83%. This film was found from grazing incidence x-ray diffractometry to have a thickness of 400 nm. The resistivity of the aluminum film was measured by the four-probe method, whereupon the resistivity was 3.7 μΩ·cm. The results are shown in Table 2.

Example 14

A substrate and a dish-shaped stainless steel vessel were prepared for use in the same way as in Example 2, and started to be heated in the same way as in Example 2. The temperature was held in this state for 15 minutes, after which heating of the substrate and dish-shaped stainless steel vessel was stopped. When the stainless steel lid was removed, the surface of the substrate was covered with a film having a silvery-white metallic luster. The ESCA spectrum of the resulting film was examined, whereupon a peak attributable to $Al_{2p}$ was observed at 73.5 eV, confirming this film to be an aluminum film. The reflectance at a wavelength of 700 nm was 73%. This film was found from grazing incidence x-ray diffractometry to have a thickness of 1,000 nm. The resistivity of the aluminum film was measured by the four-probe method, whereupon the resistivity was 3.5 μΩ·cm. The results are shown in Table 2.

Example 15

Aside from preparing for use a substrate composed of a fl-inch diameter silicon substrate having bonded thereto a 500

μm thick PET film instead of a substrate having a titanium nitride film, an aluminum film was formed in the same way as in Example 2. The ESCA spectrum of the resulting film was examined, whereupon a peak attributable to $Al_{2p}$ was observed at 73.5 eV, confirming this film to be an aluminum film. The reflectance at a wavelength of 700 nm was 68%. This film was found from grazing incidence x-ray diffractometry to have a thickness of 280 nm. The resistivity of the aluminum film was measured by the four-probe method, whereupon the resistivity was 4.5 μΩ·cm. The results are shown in Table 2.

Example 16

Aside from setting the film-forming temperature to 60° C., an aluminum film was formed in the same way as in Example 1. When the stainless steel lid was removed, the surface of the substrate was covered with a film having a silvery-white metallic luster. The ESCA spectrum of the resulting film was examined, whereupon a peak attributable to $Al_{2p}$ was observed at 73.5 eV, confirming this film to be an aluminum film. The reflectance at a wavelength of 700 nm was 65%. This film was found from grazing incidence x-ray diffractometry to have a thickness of 50 nm. The resistivity of the aluminum film was measured by the four-probe method, whereupon the resistivity was 5.1 μΩ·cm. The results are shown in Table 2.

Example 17

Aside from setting the film-forming temperature to 70° C., an aluminum film was formed in the same way as in Example 1. When the stainless steel lid was removed, the surface of the substrate was covered with a film having a silvery-white metallic luster. The ESCA spectrum of the resulting film was examined, whereupon a peak attributable to $Al_{2p}$ was observed at 73.5 eV, confirming this film to be an aluminum film. The reflectance at a wavelength of 700 nm was 73%. This film was found from grazing incidence x-ray diffractometry to have a thickness of 190 nm. The resistivity of the aluminum film was measured by the four-probe method, whereupon the resistivity was 4.4 μΩ·cm. The results are shown in Table 2.

Example 18

Aside from setting the film-forming temperature to 90° C., an aluminum film was formed in the same way as in Example 5. When the stainless steel lid was removed, the surface of the substrate was covered with a film having a silvery-white metallic luster. The ESCA spectrum of the resulting film was examined, whereupon a peak attributable to $Al_{2p}$ was observed at 73.5 eV, confirming this film to be an aluminum film. The reflectance at a wavelength of 700 nm was 67%. This film was found from grazing incidence x-ray diffractometry to have a thickness of 300 nm. The resistivity of the aluminum film was measured by the four-probe method, whereupon the resistivity was 4.0 μΩ·cm. The results are shown in Table 2.

Example 19

PET Film and Atmospheric Pressure CVD→Atmospheric Pressure CVD

Aside from preparing for use a substrate composed of a 4-inch diameter silicon substrate having bonded thereto a 500 μm thick PET film instead of a substrate having a titanium nitride film, an aluminum film was formed in the same way as in Example 3. The ESCA spectrum of the resulting film was examined, whereupon a peak attributable to $Al_{2p}$ was observed at 73.5 eV, confirming this film to be an aluminum film. The reflectance at a wavelength of 700 nm was 68%. This film was found from grazing incidence x-ray diffractometry to have a thickness of 280 nm. The resistivity of the aluminum film was measured by the four-probe method, whereupon the resistivity was 4.5 μΩ·cm. The results are shown in Table 2 (Tables 2-1 to 2-4).

TABLE 2-1

| | Substrate | | Titanium-containing film-forming step | | | |
|---|---|---|---|---|---|---|
| Ex | Surface | Plasma treatment | Composition/ complex | Film-forming temperature (° C.) | Film-forming time (minutes) | Film-forming pressure (Pa) |
| 1 | TiN | no | — | — | — | — |
| 2 | TiN | no | (1) | | coating | |
| 3 | TiN | no | TDMAT | 100 | 1 | $1.02 \times 10^5$ |
| 4 | TiN | no | TDMAT | 50 | 1 | $1.33 \times 10^3$ |
| 5 | TiN | no | TDMAT | 100 | 1 | $1.02 \times 10^5$ |
| 6 | TiN | no | — | — | — | — |
| 7 | TiN | no | — | — | — | — |
| 8 | TiN | no | (1) | | coating | |
| 9 | TiN | no | — | — | — | — |
| 10 | TiN | no | (1) | | coating | |

TDMAT: tetrakis(dimethylamido)titanium

TABLE 2-2

| | | Aluminum film-forming conditions | | | Aluminum film | | |
|---|---|---|---|---|---|---|---|
| Ex | Complex | Film-forming temperature (° C.) | Film-forming time (minutes) | Film-forming pressure (Pa) | Reflectance (%) | Film thickness (nm) | Resistivity (μΩ·cm) |
| 1 | (1) | 75 | 5 | $1.02 \times 10^5$ | 75 | 350 | 4.0 |
| 2 | (1) | 75 | 5 | $1.02 \times 10^5$ | 80 | 400 | 3.8 |
| 3 | (1) | 75 | 5 | $1.02 \times 10^5$ | 84 | 410 | 3.6 |
| 4 | (1) | 75 | 5 | $1.02 \times 10^5$ | 82 | 400 | 3.6 |
| 5 | (1) | 50 | 5 | $1.33 \times 10^3$ | 80 | 420 | 3.8 |
| 6 | (1) | 150 | 5 | $1.02 \times 10^5$ | 80 | 400 | 3.6 |
| 7 | (2) | 75 | 5 | $1.02 \times 10^5$ | 70 | 250 | 4.4 |
| 8 | (2) | 75 | 5 | $1.02 \times 10^5$ | 75 | 290 | 4.2 |
| 9 | (3) | 85 | 5 | $1.02 \times 10^5$ | 70 | 250 | 4.4 |
| 10 | (3) | 85 | 5 | $1.02 \times 10^5$ | 79 | 280 | 4.1 |

TABLE 2-3

| | Substrate | | Titanium-containing film-forming step | | | |
|---|---|---|---|---|---|---|
| Ex | Surface | Plasma treatment | Composition/ complex | Film-forming temperature (° C.) | Film-forming time (minutes) | Film-forming pressure (Pa) |
| 11 | TiN | no | — | — | — | — |
| 12 | TaN | no | — | — | — | — |
| 13 | TiN | yes | — | — | — | — |
| 14 | TiN | no | (1) | | coating | |
| 15 | PET | no | (1) | | coating | |
| 16 | TiN | no | — | — | — | — |
| 17 | TiN | no | — | — | — | — |
| 18 | TiN | no | — | — | — | — |
| 19 | PET | no | TDMAT | 100 | 1 | $1.02 \times 10^5$ |

TDMAT: tetrakis(dimethylamido)titanium

TABLE 2-4

| | | Aluminum film-forming conditions | | | Aluminum film | | |
|---|---|---|---|---|---|---|---|
| Ex | Complex | Film-forming Temperature (° C.) | Film-forming Time (minutes) | Film-forming Pressure (Pa) | Reflectance (%) | Film thickness (nm) | Resistivity (μΩ·cm) |
| 11 | (1) | 75 | 5 | $1.02 \times 10^5$ | 75 | 330 | 4.1 |
| 12 | (1) | 75 | 5 | $1.02 \times 10^5$ | 75 | 350 | 4.0 |
| 13 | (1) | 75 | 5 | $1.02 \times 10^5$ | 83 | 400 | 3.7 |
| 14 | (1) | 75 | 15 | $1.02 \times 10^5$ | 73 | 1,000 | 3.5 |
| 15 | (1) | 75 | 5 | $1.02 \times 10^5$ | 68 | 280 | 4.5 |
| 16 | (1) | 60 | 5 | $1.02 \times 10^5$ | 65 | 50 | 5.1 |
| 17 | (1) | 70 | 5 | $1.02 \times 10^5$ | 73 | 190 | 4.4 |
| 18 | (3) | 90 | 5 | $1.02 \times 10^5$ | 67 | 300 | 4.0 |
| 19 | (1) | 75 | 5 | $1.02 \times 10^5$ | 78 | 300 | 3.8 |

Examples 20 to 32

Evaluation of Gap-Filling Properties

Aside from using a substrate having on one side thereof linear trenches with a width of 30 nm and a depth of 200 nm (aspect ratio, 10), an aluminum film was formed on the surface of the substrate in the same way as in Examples 1 to 5, 7 to 10, 12 and 13. Each of the substrates used had a titanium nitride film or a tantalum nitride film formed at the interior of the trenches. Following aluminum film formation, the substrate was cut in a direction perpendicular to the lengthwise direction of the trenches. Upon examining the cut face with a scanning electron microscope, even the interior of the trenches was found to be uniformly filled with aluminum. The film-forming conditions and the results are shown in Table 3 (Tables 3-1 to 3-4). In the "Gap-filling properties" column in Table 3, "good" indicates that good gap-filling properties were obtained in which even the interiors of the trenches were uniformly filled with aluminum.

TABLE 3-1

| | Substrate | | Titanium-containing film-forming step | | | |
|---|---|---|---|---|---|---|
| Ex | Surface | Plasma treatment | Composition/ complex | Film-forming temperature (° C.) | Film-forming time (minutes) | Film-forming pressure (Pa) |
| 20 | TiN | no | — | — | — | — |
| 21 | TiN | no | (1) | | coating | |
| 22 | TiN | no | TDMAT | 100 | 1 | $1.02 \times 10^5$ |
| 23 | TiN | no | TDMAT | 50 | 1 | $1.33 \times 10^3$ |
| 24 | TiN | no | TDMAT | 100 | 1 | $1.02 \times 10^5$ |
| 25 | TiN | no | — | — | — | — |
| 26 | TiN | no | (1) | | coating | |

TDMAT: tetrakis(dimethylamido)titanium

TABLE 3-2

| | | Aluminum film-forming conditions | | | |
|---|---|---|---|---|---|
| Ex | Complex | Film-forming temperature (° C.) | Film-forming time (minutes) | Film-forming pressure (Pa) | Gap-filling properties |
| 20 | (1) | 75 | 5 | $1.02 \times 10^5$ | good |
| 21 | (1) | 75 | 5 | $1.02 \times 10^5$ | good |
| 22 | (1) | 75 | 5 | $1.02 \times 10^5$ | good |
| 23 | (1) | 75 | 5 | $1.02 \times 10^5$ | good |
| 24 | (1) | 50 | 5 | $1.33 \times 10^3$ | good |
| 25 | (2) | 75 | 5 | $1.02 \times 10^5$ | good |
| 26 | (2) | 75 | 5 | $1.02 \times 10^5$ | good |

TABLE 3-3

| | Substrate | | Titanium-containing film-forming step | | | |
|---|---|---|---|---|---|---|
| Ex | Surface | Plasma treatment | Composition/ complex | Film-forming temperature (° C.) | Film-forming time (minutes) | Film-forming pressure (Pa) |
| 27 | TiN | no | — | — | — | — |
| 28 | TiN | no | (1) | | coating | |
| 29 | TaN | no | — | — | — | — |
| 30 | TiN | yes | — | — | — | — |
| 31 | PET | no | (1) | | coating | |
| 32 | PET | no | TDMAT | 100 | 1 | $1.02 \times 10^5$ |

TDMAT: tetrakis(dimethylamido)titanium

TABLE 3-4

| | | Aluminum film-forming conditions | | | |
|---|---|---|---|---|---|
| Ex | Complex | Film-forming temperature (° C.) | Film-forming time (minutes) | Film-forming pressure (Pa) | Gap-filling properties |
| 27 | (3) | 85 | 5 | $1.02 \times 10^5$ | good |
| 28 | (3) | 85 | 5 | $1.02 \times 10^5$ | good |
| 29 | (1) | 75 | 5 | $1.02 \times 10^5$ | good |
| 30 | (1) | 75 | 5 | $1.02 \times 10^5$ | good |
| 31 | (1) | 75 | 5 | $1.02 \times 10^5$ | good |
| 32 | (1) | 75 | 5 | $1.02 \times 10^5$ | good |

What is claimed is:

1. A method for producing a metal body, the method comprising the steps of:
   (A) heating a complex comprising a central metal atom to a first temperature so as to generator a vapor of the complex;
   (B) contacting the vapor with a substrate heated to a second temperature that is not higher than the first temperature so as to form a metal body on at least part of a surface of the substrate, the metal body comprising the central metal atom or a compound of the central metal atom, the compound being other than the complex; and
   (C) repeating step (A) and step (B) two or more times such that two or more different kinds of metal bodies are formed on the substrate;
   wherein after a first metal body which comprises titanium atoms is formed on the at least part of the surface of the substrate, a second metal body which comprises aluminum atoms is formed on the first metal body.

2. The method according to claim 1, wherein the second temperature is from 50 to 150° C.

3. The method according to claim 1, wherein the second temperature is lower than a decomposition temperature of the complex.

4. The method according to claim 1, further comprising the step of:
   (D) heating the metal body.

5. The method according to claim 1, wherein the central metal atom is an aluminum atom or a titanium atom.

6. The method according to claim 5, wherein the metal body comprises titanium atoms.

7. The method according to claim 1, further comprising the step of:
   (E) treating the substrate by plasma before step (B).

8. The method according to claim 7, wherein helium or argon is used in treating of the substrate in step (E).

9. The method according to claim 1, wherein the complex comprises a complex of titanium and an amine compound.

10. The method according to claim 1, wherein the complex comprises a complex of an amine compound and aluminum hydride.

* * * * *